US012615794B2

(12) United States Patent
Kawano et al.

(10) Patent No.: US 12,615,794 B2
(45) Date of Patent: Apr. 28, 2026

(54) SEMICONDUCTOR DEVICE AND METHOD OF MANUFACTURING THE SAME

(71) Applicant: FUJI ELECTRIC CO., LTD.,
Kawasaki (JP)

(72) Inventors: Ryouichi Kawano, Matsumoto-city
(JP); Motoyoshi Kubouchi,
Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 445 days.

(21) Appl. No.: 18/456,599

(22) Filed: Aug. 28, 2023

(65) Prior Publication Data

US 2024/0097015 A1     Mar. 21, 2024

(30) Foreign Application Priority Data

Sep. 15, 2022   (JP) ................................. 2022-146836
Apr. 6, 2023   (JP) ................................. 2023-062251

(51) Int. Cl.
H10D 12/00        (2025.01)
H10D 12/01        (2025.01)
H10D 62/17        (2025.01)

(52) U.S. Cl.
CPC ......... H10D 12/481 (2025.01); H10D 12/038
(2025.01); H10D 62/177 (2025.01)

(58) Field of Classification Search
CPC .. H10D 12/481; H10D 12/038; H10D 62/177;
H10D 62/393; H10D 64/23; H10D
62/127; H10D 62/60
See application file for complete search history.

(56) References Cited

U.S. PATENT DOCUMENTS

| | | | |
|---|---|---|---|
| 7,112,843 B2 | 9/2006 | Takaishi | |
| 7,285,822 B2 | 10/2007 | Bhalla et al. | |
| 7,399,677 B2 | 7/2008 | Takaishi | |
| 7,605,425 B2 | 10/2009 | Bhalla et al. | |
| 7,800,169 B2 | 9/2010 | Bhalla et al. | |
| 7,923,774 B2 | 4/2011 | Bhalla et al. | |
| 8,288,229 B2 | 10/2012 | Bhalla et al. | |
| 8,597,998 B2 | 12/2013 | Bhalla et al. | |
| 10,366,985 B2 | 7/2019 | Takahashi et al. | |

(Continued)

FOREIGN PATENT DOCUMENTS

| | | |
|---|---|---|
| JP | 2004-303964 A | 10/2004 |
| JP | 2008-530800 A | 8/2008 |

(Continued)

*Primary Examiner* — Mohammad A Rahman

(57)        ABSTRACT

A semiconductor device includes: a semiconductor substrate
of a first conductivity-type; an insulated gate electrode
structure buried in a first trench provided in the semicon-
ductor substrate; a base region of a second conductivity-type
provided in the semiconductor substrate so as to be in
contact with the first trench; a first main electrode region of
the first conductivity-type provided at an upper part of the
base region so as to be in contact with the first trench; a
polysilicon film of the second conductivity-type having a
higher impurity concentration than the base region and
buried in a second trench provided in the semiconductor
substrate so as to be in contact with the base region; and a
second main electrode region provided on a bottom surface
side of the semiconductor substrate.

28 Claims, 45 Drawing Sheets

(56)                References Cited

U.S. PATENT DOCUMENTS

| | | |
|---|---|---|
| 2004/0191996 A1 | 9/2004 | Takaishi |
| 2006/0180855 A1 | 8/2006 | Bhalla et al. |
| 2007/0020850 A1 | 1/2007 | Takaishi |
| 2008/0001219 A1 | 1/2008 | Bhalla et al. |
| 2008/0001220 A1 | 1/2008 | Bhalla et al. |
| 2009/0224316 A1 | 9/2009 | Bhalla et al. |
| 2010/0200914 A1 | 8/2010 | Hamada |
| 2011/0207276 A1 | 8/2011 | Bhalla et al. |
| 2012/0329225 A1 | 12/2012 | Bhalla et al. |
| 2018/0040612 A1 | 2/2018 | Takahashi et al. |
| 2019/0371932 A1* | 12/2019 | Hashizume .......... H10D 84/143 |

FOREIGN PATENT DOCUMENTS

| | | |
|---|---|---|
| JP | 2010-186760 A | 8/2010 |
| JP | 2018-202776 A | 2/2018 |
| JP | 2019-033140 A | 2/2019 |
| JP | 2019-186252 A | 10/2019 |

\* cited by examiner

SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Applications No. 2022-146836 filed on Sep. 15, 2022 and No. 2023-062251 filed on Apr. 6, 2023, the entire contents of which are incorporated by reference herein.

BACKGROUND OF THE INVENTION

1. Field of the Invention

The present invention relates to a semiconductor device and a method of manufacturing the semiconductor device.

2. Description of the Related Art

Development of technique that compensates a decrease in tolerance in association with minimization of semiconductor devices such as an insulated gate bipolar transistor (IGBT) having a trench gate structure has grown recently, which forms contact holes so as to lead a mesa part between gate trenches to be exposed, and then subjects the mesa part between the gate trenches to etching so as to form trenches (contact trenches).

After the contact trenches are formed, p-type impurity ions such as boron (B) are implanted into the bottom surface of the respective contact trenches to form a contact region having a high impurity concentration so as to decrease a contact resistance. The respective contact trenches are then filled with a contact plug made from tungsten (W), for example, via a barrier metal film of titanium (Ti), titanium nitride (TiN), or the like.

JP 2019-186252 A discloses that a hole extraction region is provided to have a shallower depth than a body region under a trench for contact so as to ensure an ohmic contact, and that the hole extraction region is arranged within the region in which the trench for contact is present. JP 2008-530800 A discloses that a $p^+$-type layer is provided along a source body contact trench. JP2004-303964 A discloses that a polysilicon film is buried in a contact hole, and the polysilicon film is removed from a part excluding a bottom by etch back and is then subjected to annealing and that a diffusion-source layer is deposited in the contact hole. JP 2018-22776 A discloses that a semiconductor region of $p^+$-type is provided on a surface of a semiconductor substrate in contact with a bottom surface of a contact part so as to have a depth between the bottom surface of the contact part to a middle of a semiconductor region of n-type. JP2010-186760 A discloses that by forming the height of the source layer high, the source layer and the source electrode can be connected mainly on the side surface of the source layer, so that the width of the source layer can be minimized and miniaturization can be achieved, and at the same time, the insulating film having a sufficient thickness can be formed in the trench. The insulating film is not formed on the source layer, and the deep recessed structure can be formed to improve the breakdown voltage while suppressing the unevenness on the source electrode. JP 2019-33140 A discloses that a semiconductor device includes a first semiconductor layer of a first conductivity type, a second semiconductor layer of a second conductivity type, a third semiconductor layer of the first conductivity type, a first semiconductor region of the second conductivity type, a first trench, and a second trench provided between the first trenches. An insulating layer is provided inside the second trench, and a first conductivity-type second semiconductor region having an impurity concentration higher than that of the third semiconductor layer is provided on the surface of the insulating layer.

As described above, the implantation of the p-type impurity ions into the bottom surface of the respective contact trenches is typically executed so as to form the contact region having a high impurity concentration after the contact trenches are formed.

The p-type impurity ions are, however, diffused toward a region around a channel due to a thermal history such as an activation of the p-type impurity ions after the ion implantation, and the impurity concentration in the channel is thus changed, which leads to a fluctuation of a gate threshold voltage. The gate threshold voltage fluctuates since the changed amount of the gate threshold voltage varies depending on the plane of the wafer or a difference between the wafers. While the contact region is preferably decreased as much as possible, the regulation of the area is difficult because of an influence of variation of a wafer process. Since the contact area is formed to have a wider area so as to ensure a contact state reliably, the p-type impurity ions tend to be easily diffused toward the region around the channel accordingly.

SUMMARY OF THE INVENTION

In view of the foregoing problems, the present invention provides a semiconductor device having contact trenches, the semiconductor device having a configuration capable of avoiding or decreasing a variation in gate threshold voltage, and also provides a method of manufacturing the semiconductor device.

An aspect of the present invention inheres in a semiconductor device including: a semiconductor substrate of a first conductivity-type; an insulated gate electrode structure buried in a first trench provided in the semiconductor substrate; a base region of a second conductivity-type provided in the semiconductor substrate so as to be in contact with the first trench; a first main electrode region of the first conductivity-type provided at an upper part of the base region so as to be in contact with the first trench; a polysilicon film of the second conductivity-type having a higher impurity concentration than the base region and buried in a second trench provided in the semiconductor substrate so as to be in contact with the base region; and a second main electrode region provided on a bottom surface side of the semiconductor substrate.

Another aspect of the present invention inheres in a method of manufacturing a semiconductor device including: forming a first trench in a semiconductor substrate of a first conductivity-type; forming an insulated gate electrode structure in a first trench; forming a base region of a second conductivity-type in the semiconductor substrate so as to be in contact with the first trench; forming a first main electrode region of the first conductivity-type at an upper part of the base region so as to be in contact with the first trench; forming a second trench at an upper part of the semiconductor substrate so as to be in contact with the base region; burying a polysilicon film of the second conductivity-type having a higher impurity concentration than the base region in the second trench; and forming a second main electrode region on a bottom surface side of the semiconductor substrate.

DETAILED DESCRIPTION

Figure 1:
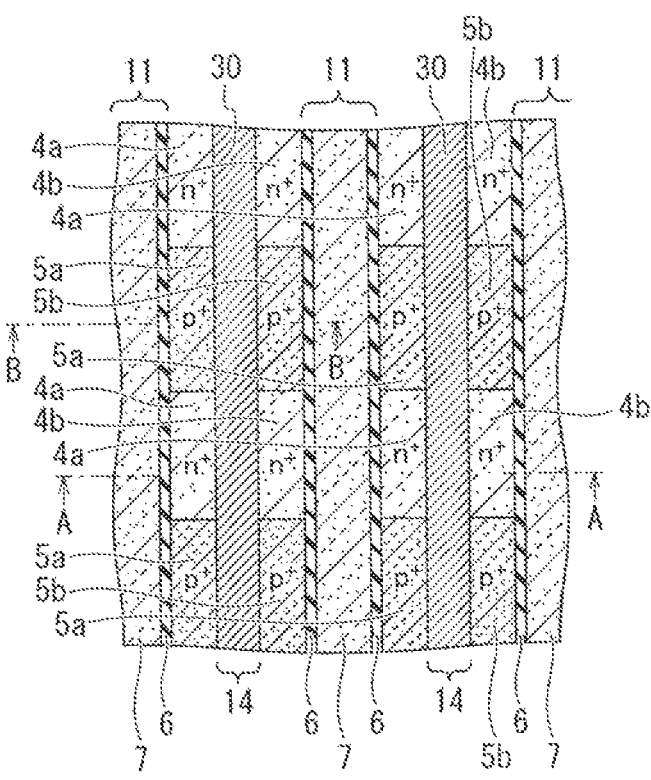
FIG. 1 is a horizontal cross-sectional view illustrating an example of a semiconductor device according to a first embodiment.

With reference to the drawings, first to seventeenth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the following description, a "first main electrode region" and a "second main electrode region" are a main electrode region of a semiconductor element, in which a main current flows in or out. The first main electrode region is assigned to a semiconductor region which is an emitter region or a collector region in an insulated gate bipolar transistor (IGBT). The first main electrode region is assigned to a semiconductor region which is a source region or a drain region in a field-effect transistor (FET) or a static induction transistor (SIT). The first main electrode region is assigned to a semiconductor region which is an anode region or a cathode region in a static induction (SI) thyristor or a gate turn-off (GTO) thyristor. The second main electrode region is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor. That is, when the first main electrode region is the source region, the second main electrode region means the drain region. When the first main electrode region is the emitter region, the second main electrode region means the collector region. When the first main electrode region is the anode region, the second main electrode region means the cathode region. A "main electrode region" is described in the specification, the main electrode region comprehensively means any one of the first main electrode region and the second main electrode region.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. In addition, an "upper surface" may be read as "front surface", and a "lower surface" may be read as "back surface".

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

DETAILED DESCRIPTION

First Embodiment

<Structure of Semiconductor Device>

Figure 2:
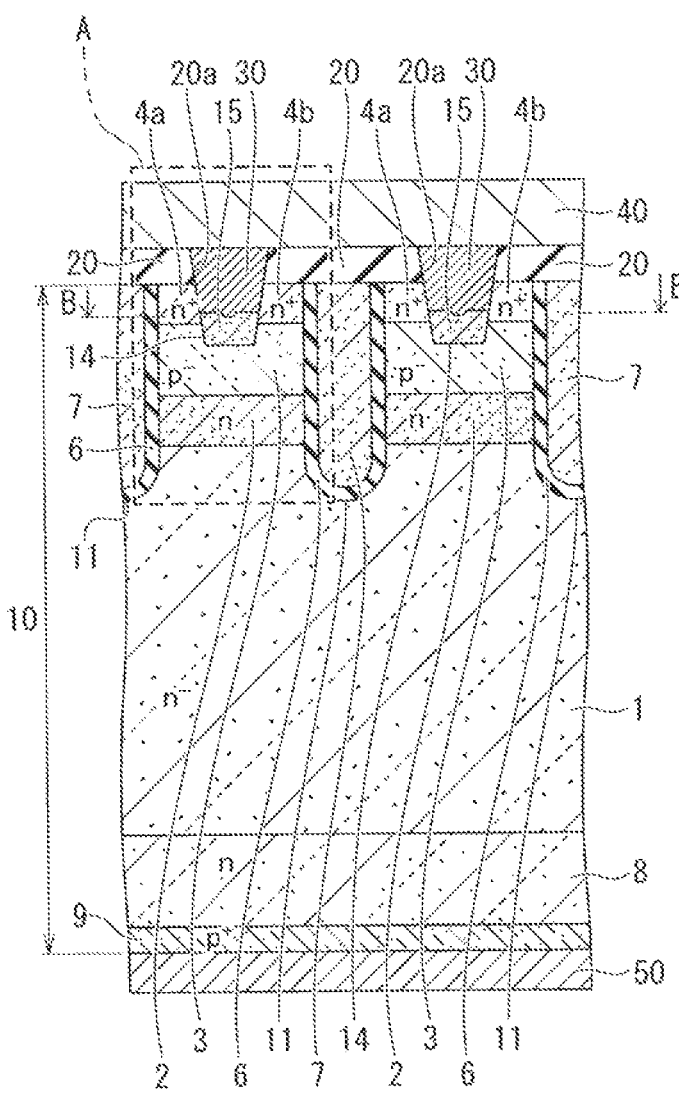
FIG. 2 is a vertical cross-sectional view as viewed from direction A-A in FIG. 1.

A semiconductor device according to a first embodiment is illustrated below with an IGBT. FIG. 1 is a horizontal cross-sectional view illustrating a part of an active region of the semiconductor device according to the first embodiment as viewed from the top surface (the front surface) side. FIG. 2 is a vertical cross-sectional view as viewed from direction A-A in FIG. 1. The horizontal cross section as viewed from direction B-B in FIG. 2 corresponds to FIG. 1.

As illustrated in FIG. 2, the semiconductor device according to the first embodiment includes a semiconductor substrate 10. The semiconductor substrate 10 is a silicon (Si) substrate, for example. The semiconductor substrate 10 is not limited to the Si substrate, and may be any other semiconductor substrate of a semiconductor (a wide bandgap semiconductor) having a wider band gap than Si, such as silicon carbide (SiC), gallium nitride (GaN), gallium oxide ($Ga_2O_3$), diamond (C), or aluminum nitride (AlN).

The semiconductor substrate 10 includes a drift layer 1 of a first conductivity-type ($n^-$-type). An accumulation layer 2 of n-type having a higher impurity concentration than the drift layer 1 is deposited on the top surface side of the drift layer 1. The bottom surface of the accumulation layer 2 is in contact with the top surface of the drift layer 1. The presence of the accumulation layer 2 can enhance an effect of promoting a carrier injection enhancement effect (an IE effect) so as to decrease an ON-voltage. The present embodiment does not necessarily include the accumulation layer 2.

A base region 3 of a second conductivity-type ($p^-$-type) is deposited on the top surface side of the accumulation layer 2. The bottom surface of the base region 3 is in contact with the top surface of the accumulation layer 2. In the case in which the accumulation layer 2 is not provided, the bottom surface of the base region 3 is in contact with the top surface of the drift layer 1. First main electrode regions (emitter regions) 4a and 4b of $n^+$-type are deposited on the top surface side of the base region 3. The respective bottom surfaces of the emitter regions 4a and 4b are in contact with the top surface of the base region 3. The emitter regions 4a and 4b each have a higher impurity concentration than the drift layer 1 and the accumulation layer 2.

A plurality of trenches (gate trenches) II are provided separately from each other at the upper part of the semiconductor substrate 10. The gate trenches 11 are dug from the top surface of the semiconductor substrate 10 in the depth direction that is perpendicular to the top surface of the semiconductor substrate 10. The gate trenches 11 penetrate the respective emitter regions 4a and 4b, the base region 3, and the accumulation layer 2 so as to reach the drift layer 1. The respective side surfaces of the emitter regions 4a and 4b, the base region 3, and the accumulation layer 2 are in contact with the side surfaces (the side walls) of the respective gate trenches 11.

A gate insulating film 6 is provided to cover the bottom surface and the side surfaces of the respective gate trenches 11. The gate insulating film 6 as used herein can be a single film of a silicon dioxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or a composite film including some of the above films stacked on one another.

A gate electrode 7 is buried inside the respective gate trenches 11 with the gate insulating film 6 interposed. The gate insulating film 6 and the gate electrode 7 implement an insulated gate electrode structure (6, 7). The gate electrode 7 as used herein can be made of a polysilicon film (a doped polysilicon film) heavily doped with impurity ions such as phosphorus (P) or boron (B), for example.

Some of the insulated gate electrode structures (6, 7) may serve as a gate trench part connected to a gate runner, and the other may serve as a dummy trench part not connected to the gate runner.

A gap between the respective gate trenches 11 next to each other is in a range of about 0.5 micrometers or greater and 1.5 micrometers or smaller, for example. The region between the respective gate trenches 11 next to each other is provided with a mesa part implemented by the upper part of the semiconductor substrate 10. The mesa part is a region of the semiconductor substrate 10 interposed between the respective gate trenches 11 next to each other, and is located above the deepest part of the gate trenches 11.

An interlayer insulating film 20 is deposited on the top surfaces of the mesa part of the semiconductor substrate 10 and the respective insulated gate electrode structures (6, 7). The interlayer insulating film 20 is a single film of a silicon oxide film (a $SiO_2$ film) without containing phosphorus (P) or boron (B) which is referred to as a non-doped silicate glass (NSG) film, a phosphosilicate glass film (a PSG film), a borosilicate glass film (a BSG film), a borophosphosilicate glass film (a BPSG film), a silicon nitride film (a $Si_3N_4$ film), or a high temperature oxide film (a HTO film), or a stacked layer of the above films stacked on one another.

The interlayer insulating film 20 located on the mesa part of the semiconductor substrate 10 is provided with contact holes 20a penetrating the interlayer insulating film 20. The mesa part of the semiconductor substrate 10 is provided with trenches (contact trenches) 14 connected integrally with the contact holes 20a. The respective contact trenches 14 are dug from the top surface of the mesa part of the semiconductor substrate 10 in the depth direction perpendicular to the top surface of the mesa part.

Figure 3:
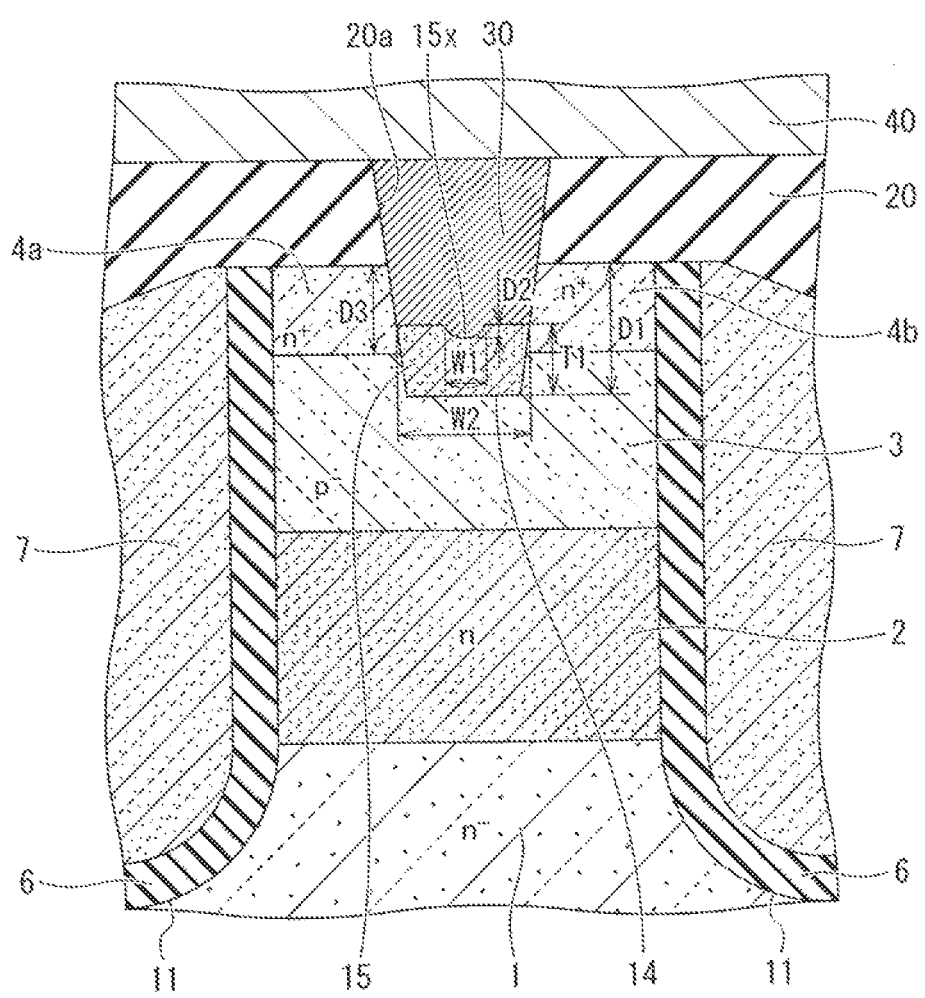
FIG. 3 is an enlarged cross-sectional view of region A in FIG. 2.

FIG. 3 is an enlarged view of region A illustrated in FIG. 2 including the circumference of the contact trench 14. FIG. 3 illustrates the contact trench 14 that penetrates the emitter regions 4a and 4b to reach the base region 3 in cross section in which the emitter regions 4a and 4b appear. A depth D1 of the contact trench 14 is greater than a depth D3 of the respective emitter regions 4a and 4b, and is in a range of about 0.2 micrometers or greater and 1.0 micrometers or smaller, for example. The depth D1 of the contact trench 14 may conform to the depth D3 of the respective emitter regions 4a and 4b, or may be shallower than the depth D3 of the respective emitter regions 4a and 4b. A width of the bottom surface of the contact trench 14 is in a range of about 0.1 micrometers or greater and 0.5 micrometers or smaller.

The side surfaces of the contact trench 14 has a tapered shape (a regular tapered shape) having a width gradually decreasing from the opening toward the bottom surface. The side surfaces of the contact trench 14 may be substantially perpendicular to the bottom surface of the contact trench 14, or may have a tapered shape (an inverse tapered shape) having a width gradually increasing from the opening toward the bottom surface. While the contact trench 14 has a flat bottom surface, the present embodiment is not limited to this case, the bottom surface of the contact trench 14 may have a curved surface convex downward, for example.

A polysilicon film 15 of $p^+$-type having a higher impurity concentration than the base region 3 is buried in the lower part of the contact trench 14. The polysilicon film 15 is a film (a doped polysilicon film) heavily doped with p-type impurity ions such as boron (B). The bottom surface of the polysilicon film 15 is in contact with the base region 3. The side surfaces of the polysilicon film 15 are in contact with the base region 3 and the respective emitter regions 4a and 4b.

A thickness T1 of the polysilicon film 15 is in a range of about 0.1 micrometers or greater and 0.8 micrometers or smaller, for example, and is about ¹⁄₁₀ or greater or ⅘ or smaller of the depth of the contact trench 14. The middle part on the top surface of the polysilicon film 15 is provided with a recess 15x. A depth D2 of the recess 15x is in a range of about 0.01 micrometers or greater and 0.1 micrometers or smaller, for example, and is about ¹⁄₁₀ or greater or ½ or smaller of the thickness T1 of the polysilicon film 15. A width W1 of the opening of the recess 15x is in a range of about 0.1 micrometers or greater and 0.4 micrometers or smaller, for example, and is ⅕ or greater and ⅘ or smaller of the width W2 of the top surface of the polysilicon film 15.

A contact part 30 is buried in the upper part of the contact trench 14 and the contact hole 20a. The bottom surface of the contact part 30 is in contact with the top surface of the polysilicon film 15. The side surfaces of the contact part 30 are in contact with the respective emitter regions 4a and 4b and the interlayer insulating film 20. The contact part 30 is in ohmic contact with the respective emitter regions 4a and 4b and the polysilicon film 15.

The contact part 30 is implemented by a barrier metal film and a contact plug. The barrier metal film to be used can be a single film made from titanium (Ti) or titanium nitride (TiN) or a stacked film including Ti and TiN, for example. The contact plug to be used can be made from metal such as tungsten (W). A metal silicide film may be interposed between the contact part 30 and each of the emitter regions 4a and 4b and the polysilicon film 15.

As illustrated in FIG. 1, the respective gate trenches 11 have a straight (stripe-shaped) planar pattern extending parallel to each other in one direction (the upper-lower direction in FIG. 1). The respective contact trenches 14 have a straight (stripe-shaped) planar pattern extending parallel to the extending direction of the gate trenches 11. The contact part 30 buried in the respective contact trenches 14 and the polysilicon film 15 hidden under the contact part 30 each have a planar pattern extending in the extending direction of the respective contact trenches 14.

The n⁺-type emitter region 4a and a p⁺-type contact region 5a are in contact with one of the side surfaces (the side surface on the left side in FIG. 1) of the respective contact trenches 14. The emitter region 4a and the contact region 5a are in contact with each other so as to be alternately and repeatedly arranged parallel to the extending direction of the respective gate trenches 11 and the respective contact trenches 14. The n⁺-type emitter region 4b and a p⁺-type contact region 5b are in contact with the other side surface (the side surface on the right side in FIG. 1) of the respective contact trenches 14. The emitter region 4b and the contact region 5b are in contact with each other so as to be alternately and repeatedly arranged parallel to the extending direction of the respective gate trenches 11 and the respective contact trenches 14.

Figure 4:
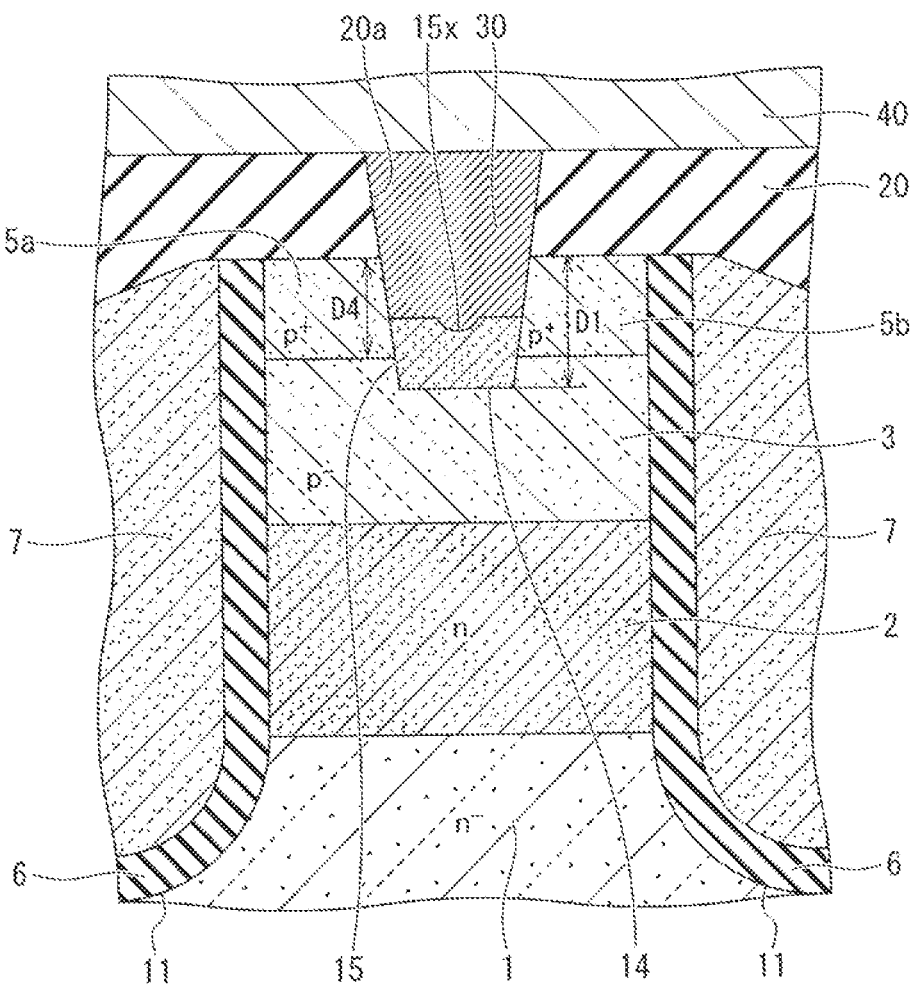
FIG. 4 is a vertical cross-sectional view as viewed from direction B-B in FIG. 1.

FIG. 4 is a vertical cross-sectional view as viewed from direction B-B in FIG. 1 passing across the respective contact regions 5a and 5b including the circumference of the contact trench 14 as in the case of FIG. 3. FIG. 4 illustrates the respective bottom surfaces of the contact regions 5a and 5b that are in contact with the top surface of the base region 3 in cross section in which the contact regions 5a and 5b appear. The respective contact regions 5a and 5b have a higher impurity concentration than the base region 3.

A depth D4 of the contact regions 5a and 5b is greater than the depth D3 of the emitter regions 4a and 4b illustrated in FIG. 3. The depth D4 of the contact regions 5a and 5b may be either the same as or shallower than the depth D3 of the emitter regions 4a and 4b.

The depth D4 of the contact regions 5a and 5b is shallower than the depth D1 of the contact trench 14. The depth D4 of the contact regions 5a and 5b may be either the same as or greater than the depth D1 of the contact trench 14.

The bottom surface of the polysilicon film 15 buried in the contact trench 14 is in contact with the base region 3. The side surfaces of the polysilicon film 15 are in contact with the base region 3 and the respective contact regions 5a and 5b. The polysilicon film 15 has a higher impurity concentration than the base region 3 and the contact regions 5a and 5b. The side surfaces of the contact part 30 are in contact with the respective contact regions 5a and 5b. The contact part 30 is in ohmic contact with the polysilicon film 15 and the respective contact regions 5a and 5b.

As illustrated in FIG. 2 to FIG. 4, a front-surface electrode (an emitter electrode) 40 is deposited on the interlayer insulating film 20. The front-surface electrode 40 is electrically connected to the emitter regions 4a and 4b and the contact regions 5a and 5b via the contact plug 30. The front-surface electrode 40 as used herein can be made from metal such as aluminum (Al), an Al alloy, or copper (Cu). Examples of Al alloys include an Al-silicon (Si) alloy, an Al—Cu—Si alloy, and an Al—Cu alloy.

As illustrated in FIG. 2, a field-stop (FS) layer 8 of n-type having a higher impurity concentration than the drift layer 1 is deposited on the bottom surface side of the drift layer 1. The top surface of the FS layer 8 is in contact with the bottom surface of the drift layer 1. The FS layer 8 prevents a depletion layer expanding from the bottom surface side of the base region 3 from reaching a second main electrode region (a collector region) 9 described below.

The collector region 9 of p⁺-type is deposited on the bottom surface side of the FS layer 8. The top surface of the collector region 9 is in contact with the bottom surface of the FS layer 8. The collector region 9 has a higher impurity concentration than the base region 3.

A rear-surface electrode (a collector electrode) 50 is deposited on the bottom surface side of the collector region 9. The rear-surface electrode 50 is, for example, made of a single film of gold (Au) or a metallic film including titanium (Ti), nickel (Ni), and gold (Au) stacked in this order.

The semiconductor device according to the first embodiment during the operation applies a positive voltage to the rear-surface electrode 50 while using the front-surface electrode 40 as a ground potential, and causes an inversion layer (a channel) to be formed in the base region 3 toward the side surface of the respective gate trenches 11 so as to be in the ON-state when a positive voltage of a threshold or greater is applied to the gate electrode 7. In the ON-state, a current flows from the rear-surface electrode 50 toward the front-surface electrode 40 through the collector region 9, the FS layer 8, the drift layer 1, the accumulation layer 2, the inversion layer of the base region 3, and the emitter regions 4a and 4b. When the voltage applied to the gate electrode 7 is smaller than the threshold, the semiconductor device is led to be the OFF-state since no inversion channel is formed in the base region 3, and no current flows from the rear-surface electrode 50 toward the front-surface electrode 40.

<Method of Manufacturing Semiconductor Device>

An example of a method of manufacturing the semiconductor device according to the first embodiment is described below with reference to FIG. 5 to FIG. 14 corresponding to the cross section illustrated in FIG. 2 or FIG. 3. The method of manufacturing the semiconductor device described below is one of examples, and it should be understood that the semiconductor device according to the first embodiment can be achieved by various manufacturing methods including modified examples within the scope of the appended claims.

Figure 5:
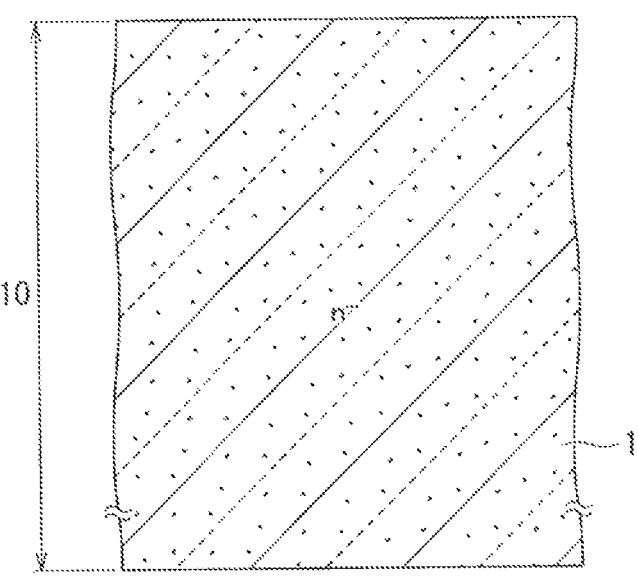
FIG. 5 is a cross-sectional process view illustrating an example of a method of manufacturing the semiconductor device according to the first embodiment.
Figure 6:
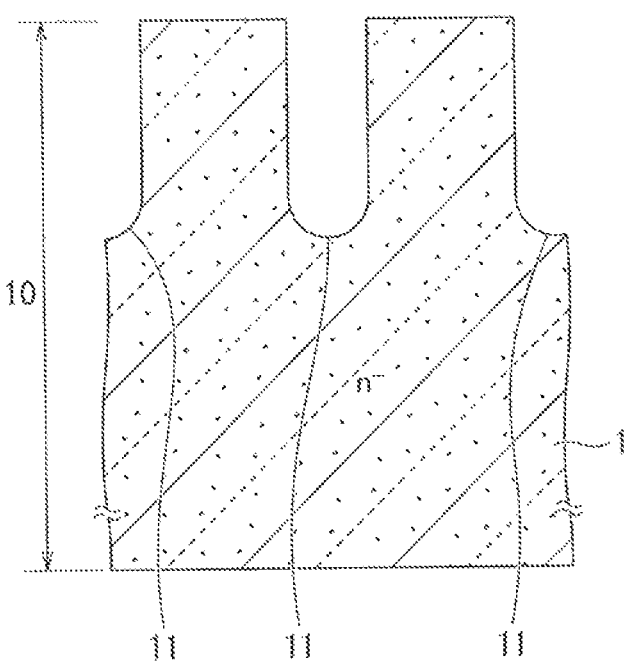
FIG. 6 is a cross-sectional process view continued from FIG. 5, illustrating the example of the method of manufacturing the semiconductor device according to the first embodiment.

First, as illustrated in FIG. 5, the semiconductor substrate 10 of the first conductivity-type (n⁻-type) made of a silicon (Si) wafer or the like is prepared. Next, the drift layer 1 is partly and selectively removed from the top surface side of the semiconductor substrate 10 by photolithography and dry etching. The plural gate trenches 11 are thus formed at the upper part of the semiconductor substrate 10, as illustrated in FIG. 6.

Figure 7:
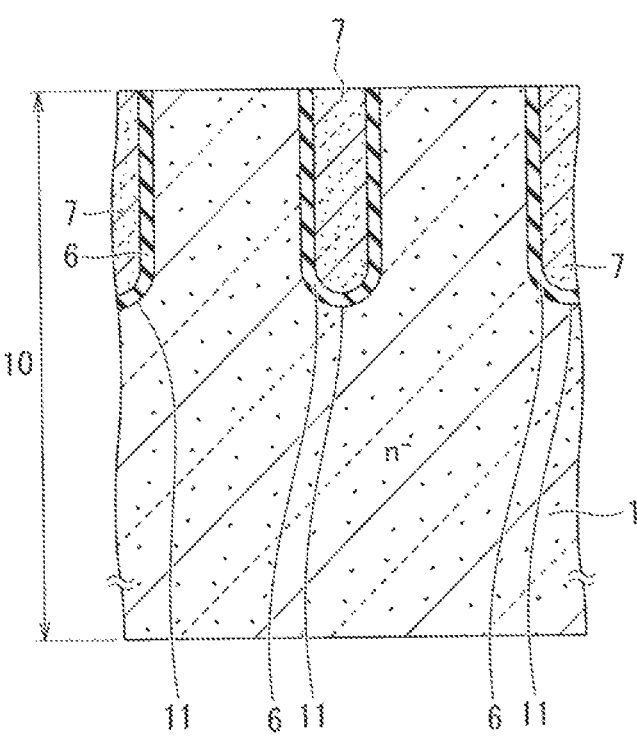
FIG. 7 is a cross-sectional process view continued from FIG. 6, illustrating the example of the method of manufacturing the semiconductor device according to the first embodiment.

Next, the gate insulating film 6 is formed on the bottom surface and the side surface of the respective gate trenches 11 by a thermal oxidation method or a chemical vapor deposition (CVD) method, for example. A polysilicon film (a doped polysilicon film) heavily doped with impurity ions such as phosphorus (P) or boron (B) is deposited so as to fill the inside of the respective gate trenches 11 with the gate insulating film 6 interposed by the CVD method and the like. The polysilicon film and the gate insulating film 6 on the semiconductor substrate 10 are then selectively removed by photolithography and dry etching. The insulated gate electrode structure (6, 7) implemented by the gate insulating film 6 and the gate electrode 7 of the polysilicon film is thus formed in the respective gate trenches 11, as illustrated in FIG. 7.

Next, p-type impurity ions such as boron (B) are implanted into the entire top surface of the drift layer 1 so as to form the p⁻-type base region 3. Further, n-type impurity ions such as phosphorus (P) or arsenic (As) are implanted into the entire top surface of the drift layer 1 so as to form the n-type accumulation layer 2.

Next, a photoresist film is applied on the top surface of the drift layer 1, and is then delineated by photolithography. Using the delineated photoresist film as a mask for ion implantation, p-type impurity ions such as boron (B) are implanted so as to form the p⁺-type contact regions 5a and 5b. The photoresist film is then removed.

Next, a photoresist film is applied on the top surface of the drift layer 1, and is then delineated by photolithography.

Using the delineated photoresist film as a mask for ion implantation, n-type impurity ions such as phosphorus (P) or arsenic (As) are implanted so as to form the n$^+$-type emitter regions 4$a$ and 4$b$. The photoresist film is then removed. The order of the ion implantation for forming the accumulation layer 2, the ion implantation for forming the base region 3, the ion implantation for forming the emitter regions 4$a$ and 4$b$, and the ion implantation for forming the contact regions 5$a$ and 5$b$ can be determined and changed as appropriate.

Figure 8:
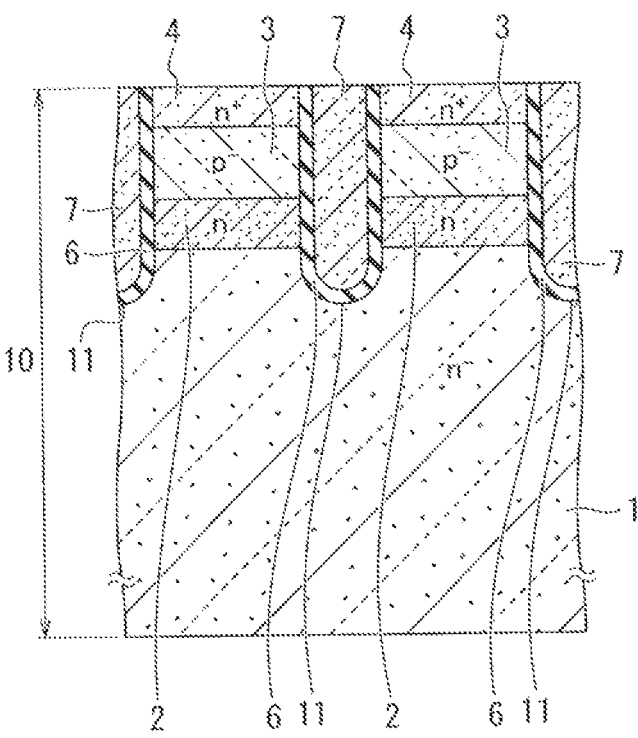
FIG. 8 is a cross-sectional process view continued from FIG. 7, illustrating the example of the method of manufacturing the semiconductor device according to the first embodiment.

Next, the impurity ions implanted into the semiconductor substrate 10 are activated by annealing. The upper part of the semiconductor substrate 10 is thus provided with the n-type accumulation layer 2, the p$^-$-type base region 3, the n$^+$-type emitter region 4, and the p$^+$-type contact region (refer to FIG. 1 and FIG. 4), as illustrated in FIG. 8.

Figure 9:
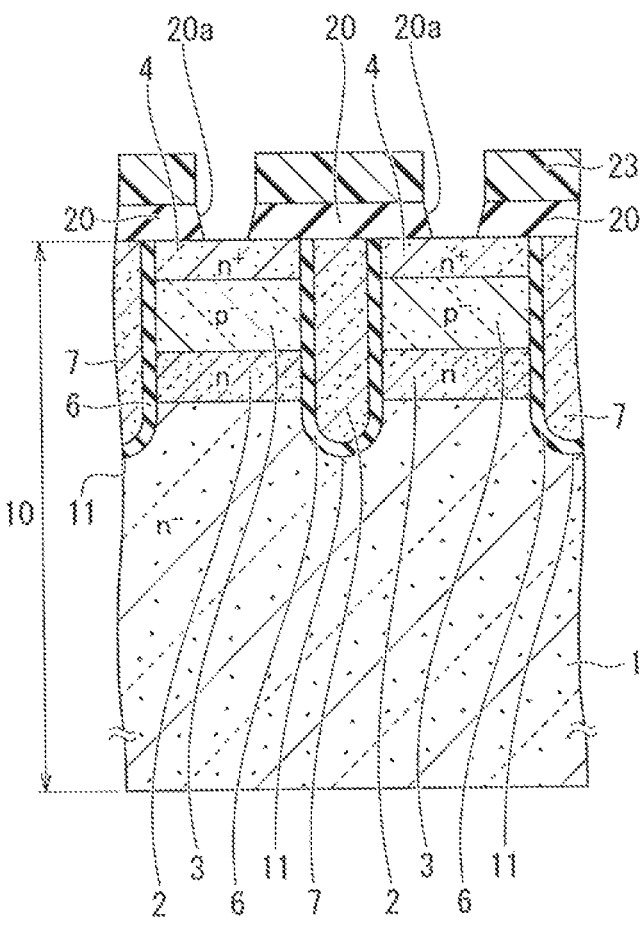
FIG. 9 is a cross-sectional process view continued from FIG. 8, illustrating the example of the method of manufacturing the semiconductor device according to the first embodiment.

Next, the interlayer insulating film 20 is formed by the CVD method and the like on the respective top surfaces of the insulated gate electrode structures (6, 7) and the emitter region 4. A photoresist film 23 is then applied on the top surface of the interlayer insulating film 20, and is delineated by photolithography. Using the delineated photoresist film 23 as a mask for etching, the interlayer insulating film 20 is partly and selectively removed by dry etching. This step opens the contact holes 20$a$ in the interlayer insulating film 20 to which the emitter region 4 is partly exposed, as illustrated in FIG. 9. The photoresist film 23 is then removed.

Figure 10:
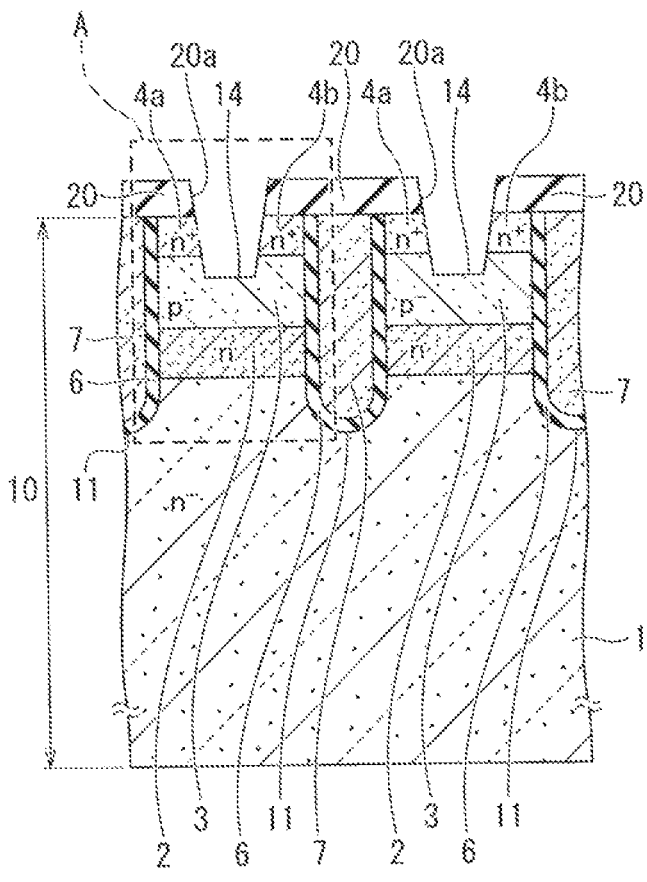
FIG. 10 is a cross-sectional process view continued from FIG. 9, illustrating the example of the method of manufacturing the semiconductor device according to the first embodiment.

Next, using the interlayer insulating film 20 as a mask for etching, the emitter region 4 and the base region 3 in the mesa part are partly and selectively removed by dry etching such as reactive ion etching (RIE). The contact trenches 14 are thus formed continuously with the contact holes 20$a$ so as to penetrate the emitter region 4 to reach the base region 3, as illustrated in FIG. 10. The emitter region 4 is divided by the contact trenches 14 so as to define the respective emitter regions 4$a$ and 4$b$.

Figure 11:
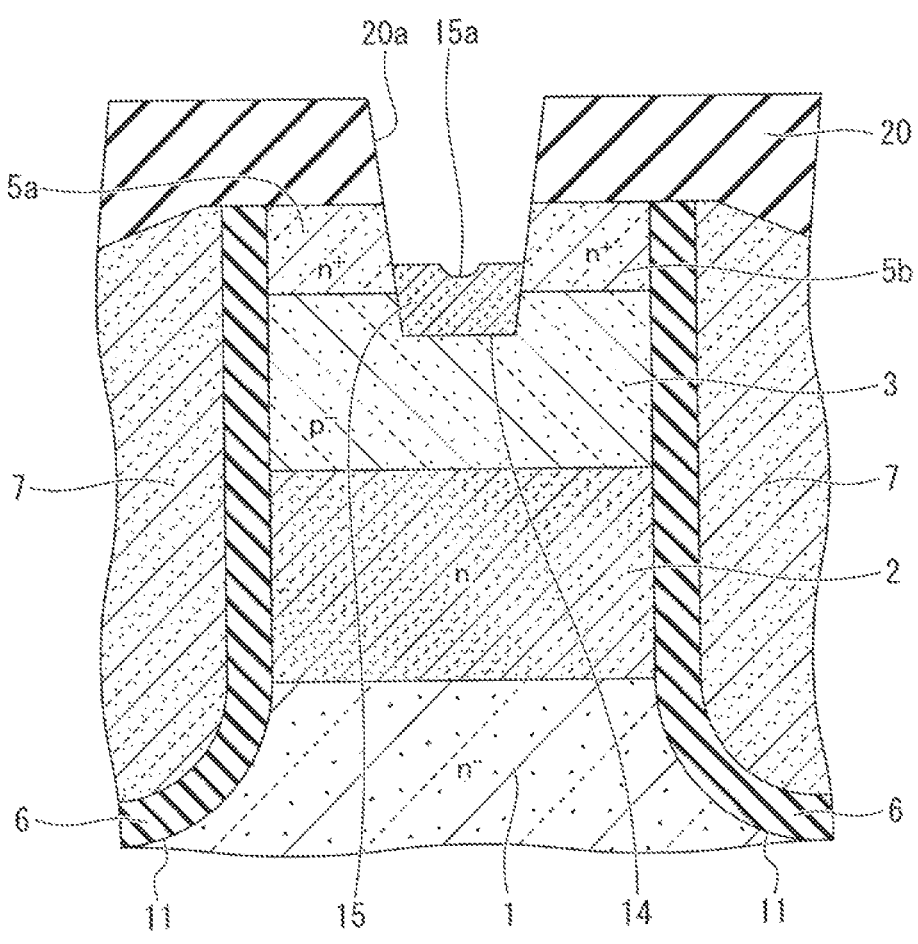
FIG. 11 is a cross-sectional process view continued from FIG. 10, illustrating the example of the method of manufacturing the semiconductor device according to the first embodiment.

Next, a polysilicon film heavily doped with p-type impurity ions such as boron (B) is deposited by the CVD method, for example. The polysilicon film is then subjected to etch-back by dry etching or the like so as to be partly and selectively removed. This step causes the polysilicon film 15 to be buried in the lower part of the respective contact trenches 14, as illustrated in FIG. 11. The polysilicon film 15 is provided with the recess 15$x$ in the middle on the top surface derived from the shape of the polysilicon film upon the deposition. The annealing is not necessarily executed after the formation of the polysilicon film 15. The polysilicon film 15 may be subjected to the annealing as appropriate so as not to cause the diffusion of the p-type impurity ions to have an influence on the impurity concentration in the channel.

Figure 12:
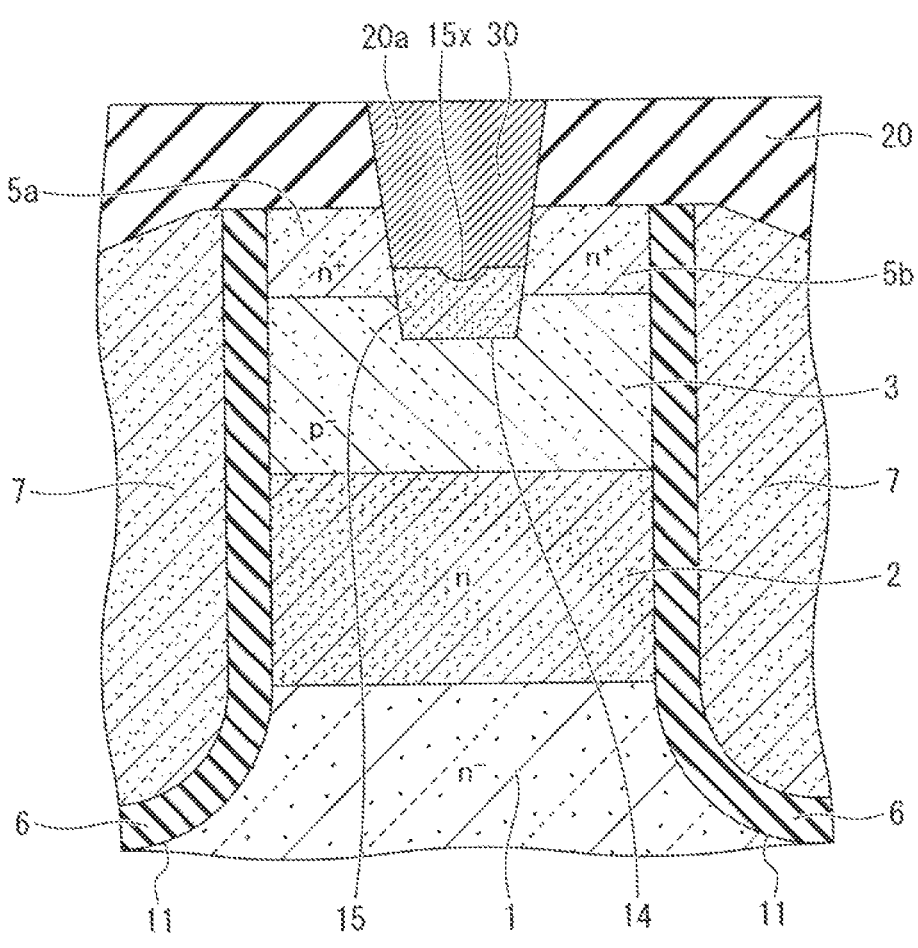
FIG. 12 is a cross-sectional process view continued from FIG. 11, illustrating the example of the method of manufacturing the semiconductor device according to the first embodiment.

Next, a barrier metal film made from titanium (Ti) and titanium nitride (TiN) and the like is formed in the contact trenches 14 and the contact holes 20$a$ by sputtering or vapor deposition and dry etching, for example. The contact trenches 14 and the contact holes 20$a$ are each then filled with the contact plug made from tungsten (W) or the like with the barrier metal film interposed by the CVD method and etch-back, for example. This step causes the contact part 30 including the barrier metal film and the contact plug to be buried in each of the contact trenches 14 and the contact holes 20$a$, as illustrated in FIG. 12.

Figure 13:
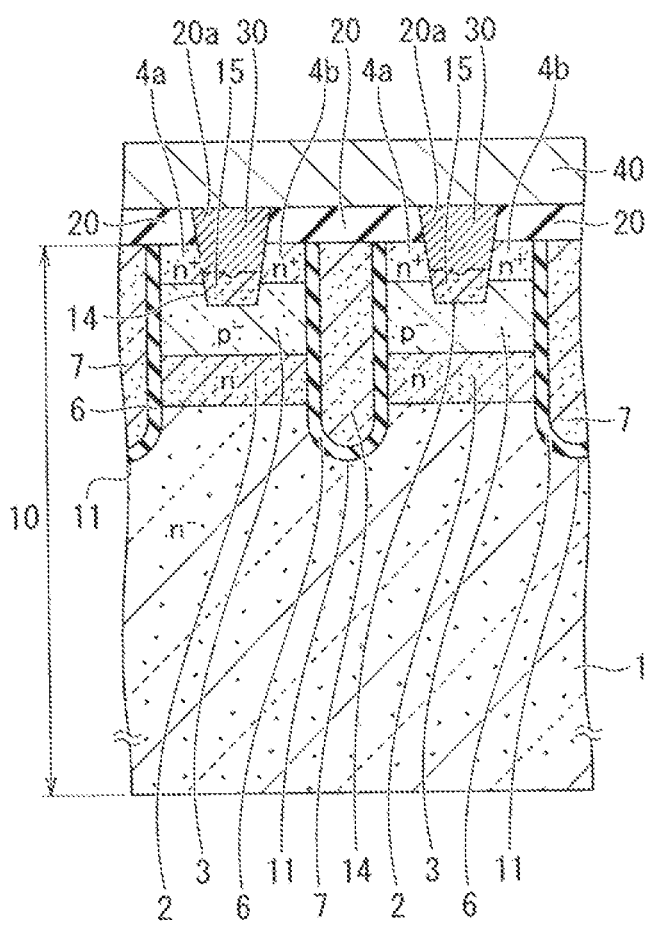
FIG. 13 is a cross-sectional process view continued from FIG. 12, illustrating the example of the method of manufacturing the semiconductor device according to the first embodiment.

Next, the front-surface electrode 40 is deposited on the top surfaces of the respective contact parts 30 and the interlayer insulating film 20 by sputtering or vapor deposition, for example, as illustrated in FIG. 13.

Figure 14:
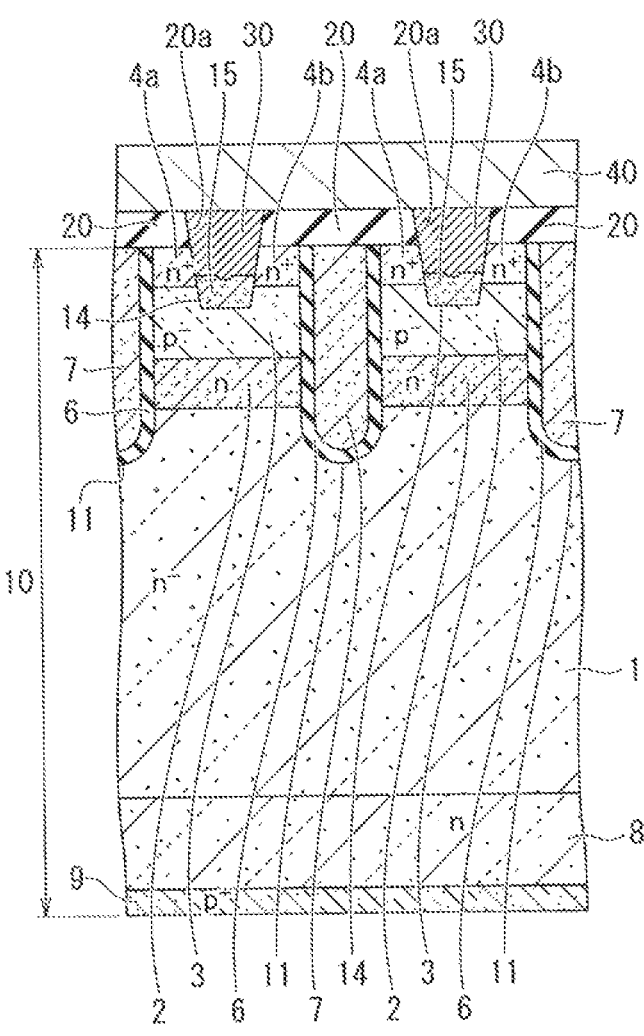
FIG. 14 is a cross-sectional process view continued from FIG. 13, illustrating the example of the method of manufacturing the semiconductor device according to the first embodiment.

Next, the semiconductor substrate 10 is ground from the bottom surface side by grinding or chemical mechanical polishing (CMP), for example, so that the thickness of the semiconductor substrate 10 is adjusted to have an intended thickness of a product. Next, n-type impurity ions such as phosphorus (P) or selenium (Se) for forming the n-type FS layer 8 are implanted into the entire bottom surface of the semiconductor substrate 10. Next, p-type impurity ions such as boron (B) for forming the p$^+$-type collector region 9 are implanted into the entire bottom surface of the semiconductor substrate 10 at a lower acceleration voltage than that upon the ion implantation executed for forming the n-type FS layer 8. The impurity ions implanted into the semiconductor substrate 10 are then activated by annealing. This step forms the n-type FS layer 8 and the p$^+$-type collector region 9 at the lower part of the semiconductor substrate 10, as illustrated in FIG. 14.

Next, the rear-surface electrode 50 including gold (Au) is formed on the entire bottom surface of the semiconductor substrate 10 by sputtering or vapor deposition, for example. Thereafter, the semiconductor substrate 10 is cut (diced) into individual pieces, so as to complete the semiconductor device according to the first embodiment as illustrated in FIG. 1 to FIG. 4.

Figure 15:
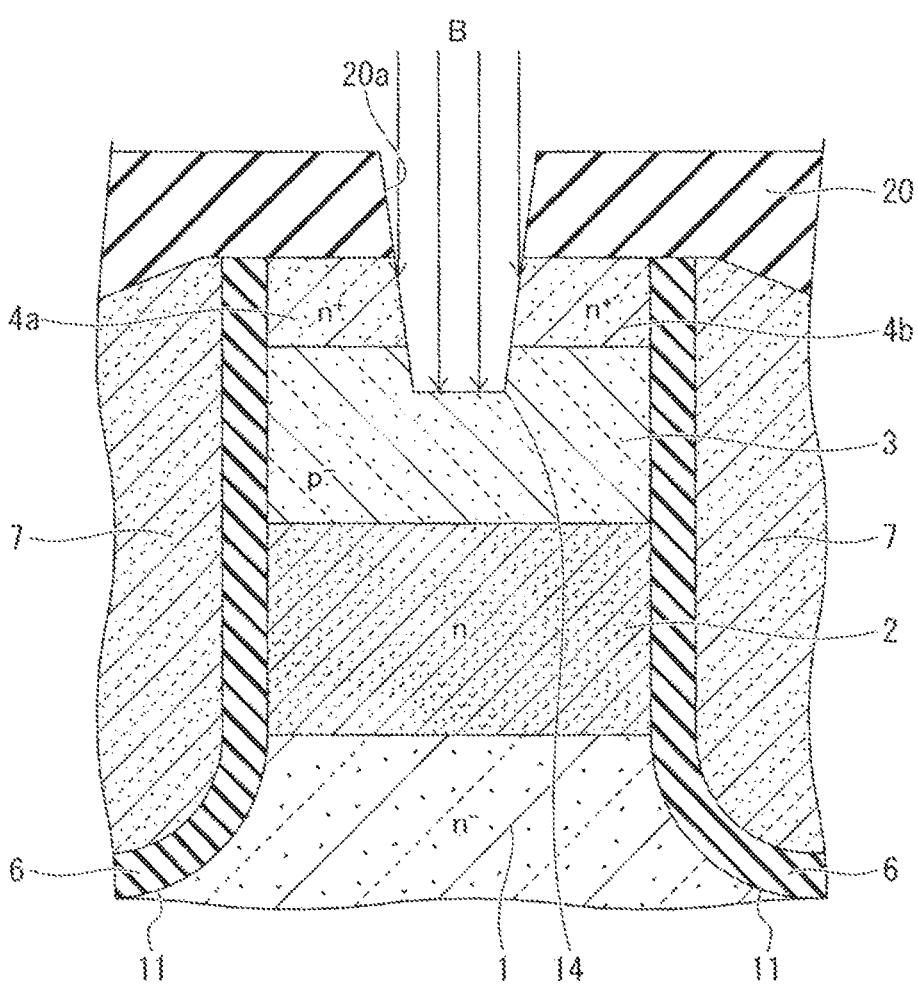
FIG. 15 is a cross-sectional process view illustrating a method of manufacturing a semiconductor device of a comparative example.
Figure 16:
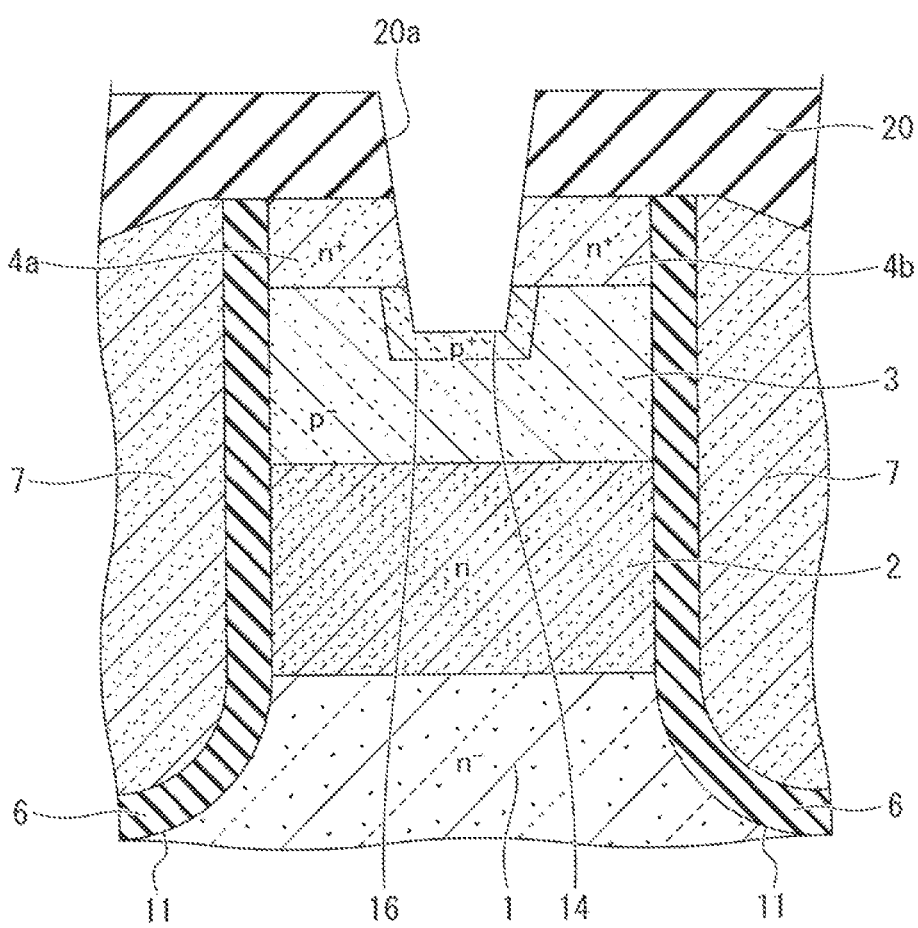
FIG. 16 is a cross-sectional process view continued from FIG. 15, illustrating the method of manufacturing the semiconductor device of the comparative example.

A method of manufacturing a semiconductor device of a comparative example is described below. The method of manufacturing the semiconductor device of the comparative example includes the same process as the method of manufacturing the semiconductor device according to the first embodiment by the step of forming the contact trenches 14 illustrated in FIG. 10. The method of manufacturing the semiconductor device of the comparative example includes a step of implanting p-type impurity ions into the bottom surface of the respective contact trenches 14, as illustrated in FIG. 15, after forming the contact trenches 14 illustrated in FIG. 10. Subsequently, the annealing is executed so as to activate the p-type impurity ions to form a p$^+$-type contact region 16, as illustrated in FIG. 16. Thereafter, a barrier metal film and a contact plug are buried in the respective contact trenches 14.

The method of manufacturing the semiconductor device of the comparative example leads the p-type impurity ions to be diffused toward a region adjacent to the channel because of the annealing after the implantation of the p-type impurity ions into the bottom surface of the respective contact trenches 14. This causes the impurity ions in the channel to fluctuate to vary the gate threshold voltage accordingly. Since the positions of the contact trenches 14 inevitably change slightly because of a variation in the wafer process, the contact region 16 to be formed needs to have a wide area, leading the p-type impurity ions to be easily diffused toward the area adjacent to the channel.

The method of manufacturing the semiconductor device according to the first embodiment differs from that of the comparative example in providing the polysilicon film 15 in the respective contact trenches 14 so as to lead the polysilicon film 15 to be in ohmic contact with the contact part 30, which can decrease the contact resistance. The implantation of the p-type impurity ions into the bottom surface of the respective contact trenches 14 thus does not need to be executed. This avoids the diffusion of the implanted p-type impurity ions toward the region adjacent to the channel, so as to suppress a variation in the gate threshold voltage derived from the fluctuation of the impurity concentration in the channel.

The configuration according to the first embodiment can also ensure the area necessary for the ohmic contact due to the presence of the polysilicon film 15 if the respective positions of the contact trenches 14 are displaced because of a variation in the wafer process. This can decrease the width of the polysilicon film 15 as compared with the width of the contact region 16 formed by the ion implantation. The present embodiment thus can minimize the diffusion of the p-type impurity ions toward the channel, so as to avoid a variation in the gate threshold voltage accordingly.

The method of manufacturing the semiconductor device of the comparative example also causes the contact trenches 14 to have a large aspect ratio in association with the minimization of the semiconductor device, and thus may lead the barrier metal film to be cut off at the connected parts between the side walls and the bottom surface upon the formation of the barrier metal film, causing a separation of the barrier metal film starting from the cut-off parts accordingly.

As compared with the comparative example, the method of manufacturing the semiconductor device according to the first embodiment leads the polysilicon film 15 to be buried in the lower part of the respective contact trenches 14 so as to have a small aspect ratio of the contact trenches 14 at the parts at which the contact parts 30 are provided. This configuration can prevent the cut-off of the barrier metal film implementing the respective contact parts 30 when formed, so as to avoid a separation of the barrier metal film starting from the cut-off parts accordingly.

Second Embodiment

Figure 17:
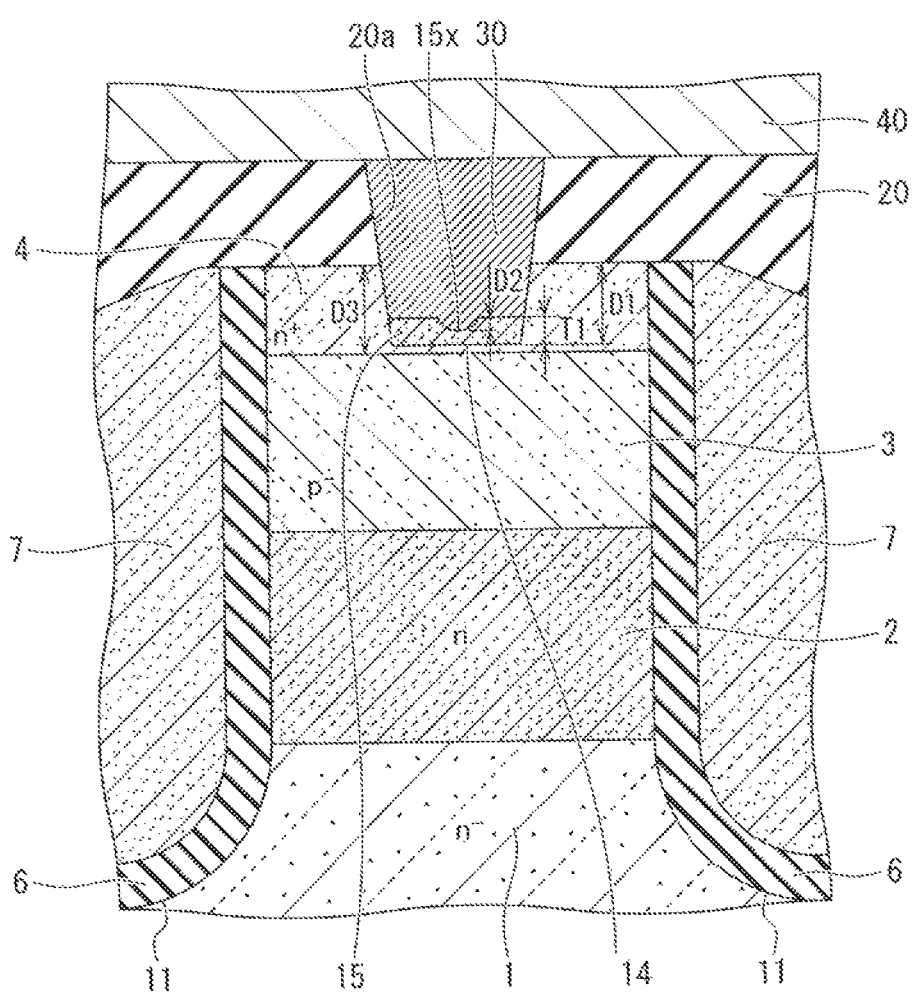
FIG. 17 is a vertical cross-sectional view illustrating an example of a semiconductor device according to a second embodiment.

FIG. 17 is a cross-sectional view illustrating a semiconductor device according to a second embodiment in which the emitter region 4 appears, and corresponds to the cross-sectional view of the semiconductor device according to the first embodiment illustrated in FIG. 3. As illustrated in FIG. 17, the semiconductor device according to the second embodiment differs from the semiconductor device according to the first embodiment in that the respective contact trenches 14 do not penetrate the emitter region 4 so as to be provided separately from the base region 3. The depth D1 of the respective contact trenches 14 is shallower than the depth D3 of the emitter region 4. The bottom surface of the respective contact trenches 14 is located inside the emitter region 4. The side surfaces and the bottom surface of the polysilicon film 15 buried in the respective contact trenches 14 are in contact with the emitter region 4.

Figure 18:
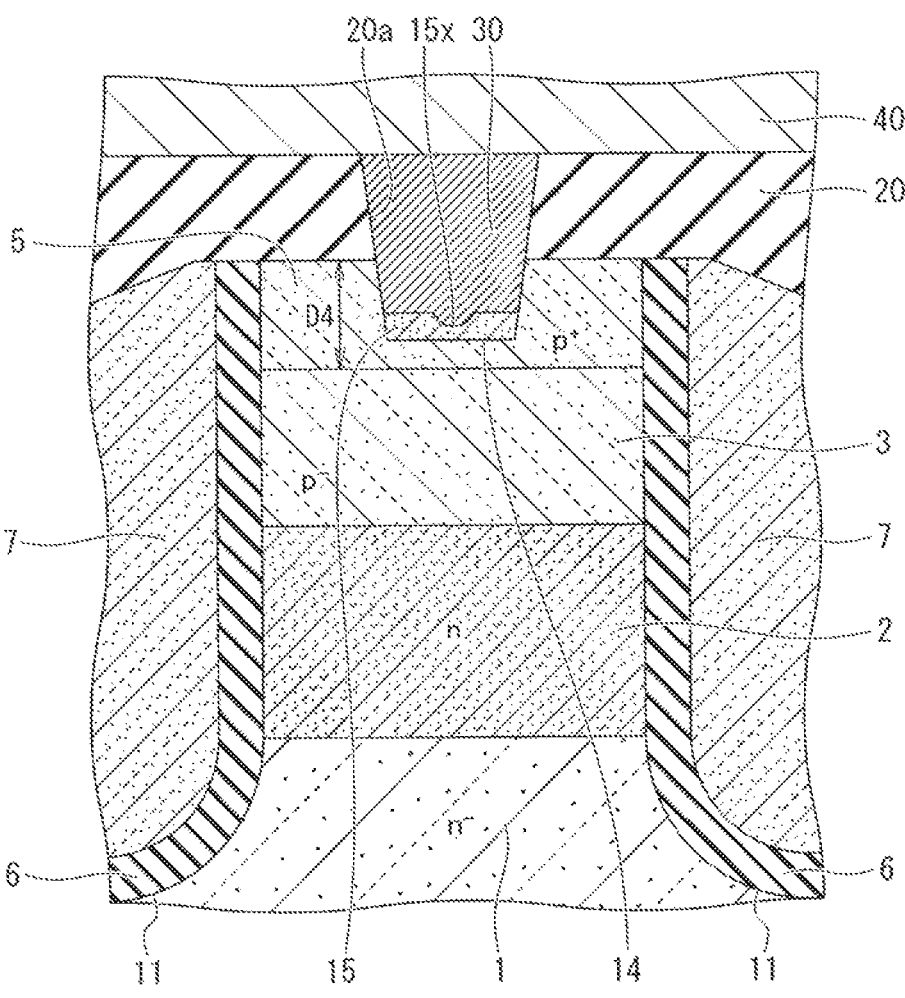
FIG. 18 is another vertical cross-sectional view illustrating the example of the semiconductor device according to the second embodiment.

FIG. 18 is a cross-sectional view illustrating the semiconductor device according to the second embodiment in which the contact region 5 appears, and corresponds to the cross-sectional view of the semiconductor device according to the first embodiment illustrated in FIG. 4. As illustrated in FIG. 18, the respective contact trenches 14 do not penetrate the contact region 5 so as to be provided separately from the base region 3. The depth D4 of the contact region 5 is greater than the depth D3 of the emitter region 4 illustrated in FIG. 17. The bottom surface of the respective contact trenches 14 is located inside the contact region 5. The side surfaces and the bottom surface of the polysilicon film 15 buried in the respective contact trenches 14 are in contact with the contact region 5. The other configurations of the semiconductor device according to the second embodiment are the same as those of the semiconductor device according to the first embodiment, and overlapping explanations are not repeated below.

The semiconductor device according to the second embodiment, which has the configuration in which the respective contact trenches 14 do not penetrate the emitter region 4 or the contact region 5 but are separated from the base region 3, can also avoid a variation in the gate threshold voltage derived from the wafer process due to the provision of the polysilicon film 15 deposited in the respective contact trenches 14.

Third Embodiment

Figure 19:
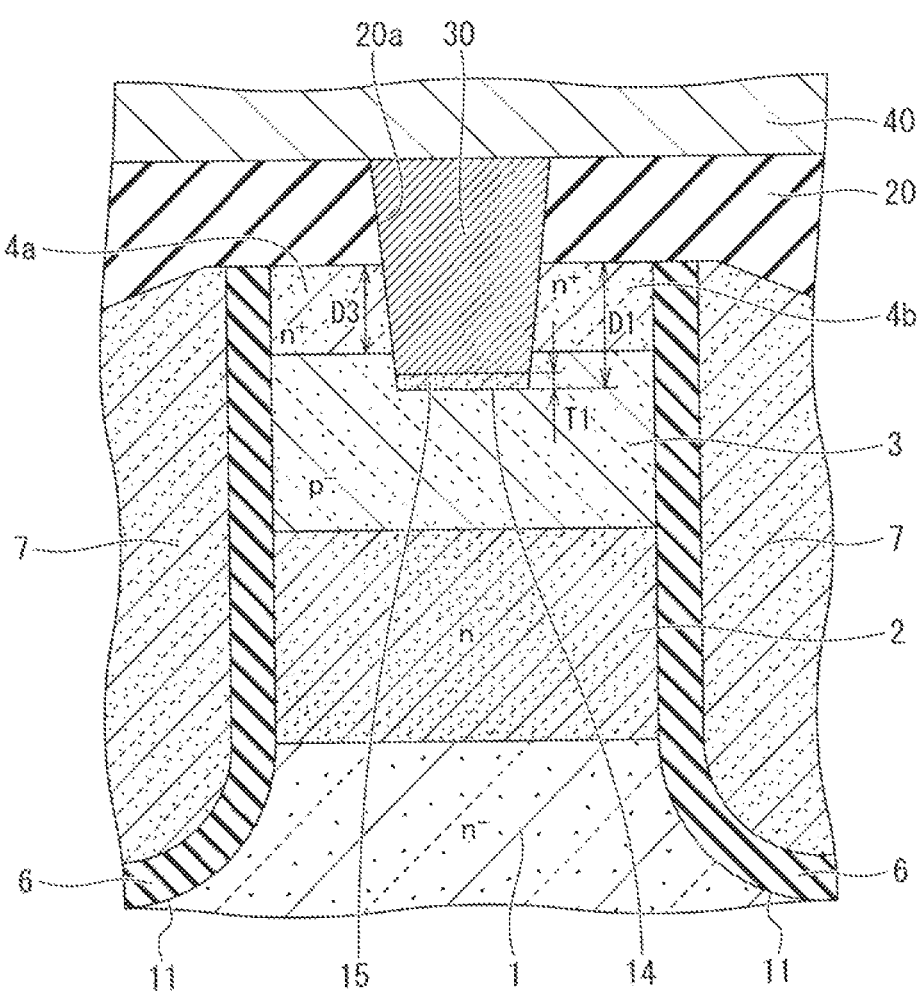
FIG. 19 is a vertical cross-sectional view illustrating an example of a semiconductor device according to a third embodiment.

FIG. 19 is a cross-sectional view illustrating a semiconductor device according to a third embodiment in which the emitter regions 4a and 4b appear, and corresponds to the cross-sectional view of the semiconductor device according to the first embodiment illustrated in FIG. 3. As illustrated in FIG. 19, the semiconductor device according to the third embodiment differs from the semiconductor device according to the first embodiment in that the polysilicon film 15 buried in lower part of the respective contact trenches 14 has a substantially rectangular shape in cross section. The top surface of the polysilicon film 15 is not provided with a recess but is a flat surface. The thickness T1 of the polysilicon film 15 is less than the thickness T1 of the polysilicon film 15 illustrated in FIG. 3.

The shape of the polysilicon film 15 illustrated in FIG. 19 can be achieved such that the respective conditions are regulated, such as the film-forming conditions when forming the polysilicon film on the entire surface by the CVD method or the like or the etching conditions when partly removing the polysilicon film by dry etching or wet etching.

Figure 20:
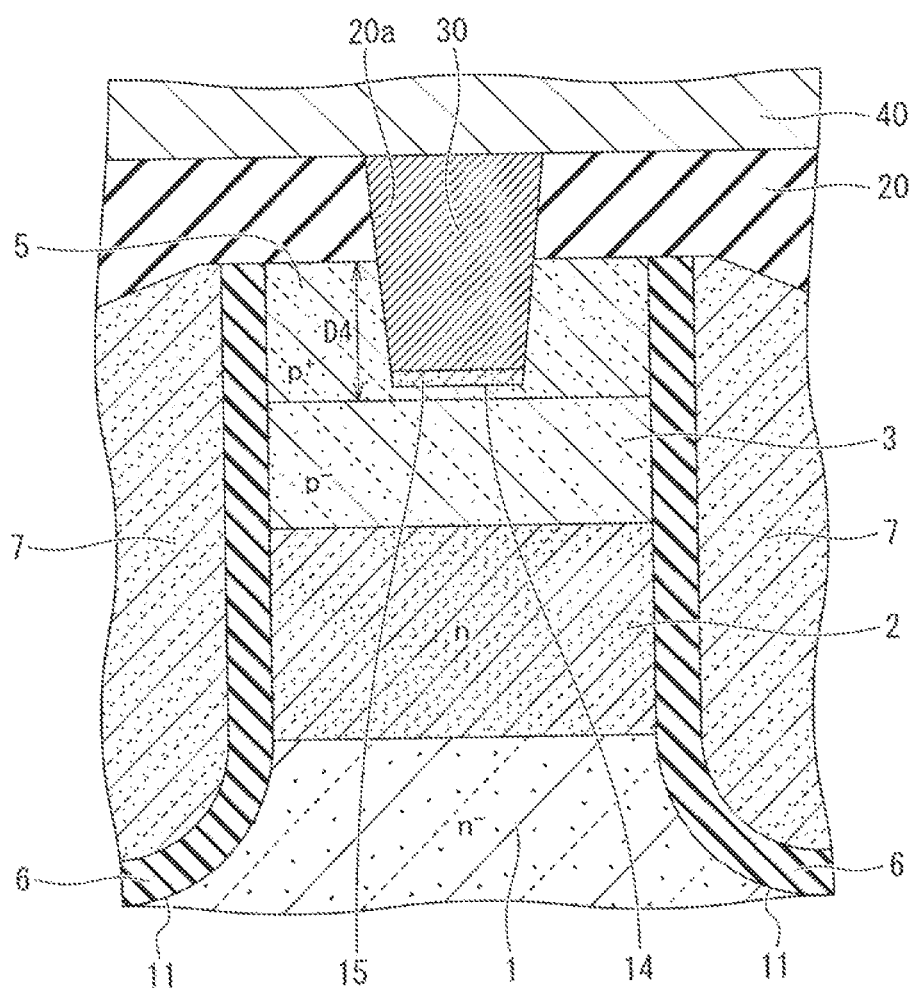
FIG. 20 is another vertical cross-sectional view illustrating the example of the semiconductor device according to the third embodiment.

FIG. 20 is a cross-sectional view illustrating the semiconductor device according to the third embodiment in which the contact region 5 appears, and corresponds to the cross-sectional view of the semiconductor device according to the first embodiment illustrated in FIG. 4. The depth D4 of the contact region 5 is greater than the depth D3 of the emitter regions 4a and 4b and the depth D1 of the respective contact trenches 14 illustrated in FIG. 19. The bottom surface of the respective contact trenches 14 is located inside the contact region 5. The side surfaces and the bottom surface of the polysilicon film 15 are in contact with the contact region 5. The other configurations of the semiconductor device according to the third embodiment are the same as those of the semiconductor device according to the first embodiment, and overlapping explanations are not repeated below.

The semiconductor device according to the third embodiment, which has the configuration in which the polysilicon film 15 buried in the lower part of the respective contact trenches 14 has the substantially rectangular shape in cross section, can also avoid a variation in the gate threshold voltage derived from the wafer process. Further, the semiconductor device according to the third embodiment has the configuration in which the thickness T1 of the polysilicon film 15 is small so that the contact part 30 is deposited deeply toward the bottom of the respective contact trenches 14, as compared with that in the semiconductor device according to the first embodiment, so as to prevent a latch-up more reliably.

Fourth Embodiment

Figure 21:
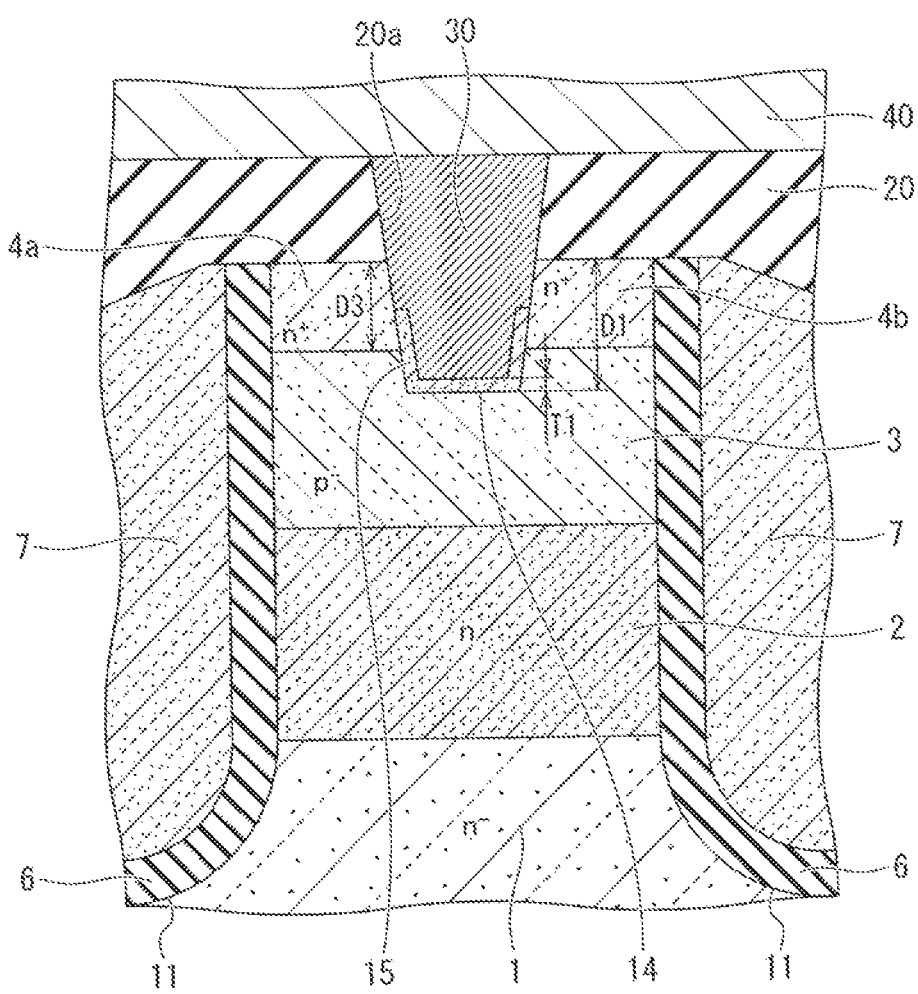
FIG. 21 is a vertical cross-sectional view illustrating an example of a semiconductor device according to a fourth embodiment.

FIG. 21 is a cross-sectional view illustrating a semiconductor device according to a fourth embodiment in which the emitter regions 4a and 4b appear, and corresponds to the cross-sectional view of the semiconductor device according to the first embodiment illustrated in FIG. 3. As illustrated in FIG. 21, the semiconductor device according to the fourth embodiment differs from the semiconductor device according to the first embodiment in that the polysilicon film 15 buried in the respective contact trenches 14 has a substantially U-like shape in cross section. The polysilicon film 15 is deposited along the bottom surface and the lower part of the respective side surfaces of the contact trenches 14.

The shape of the polysilicon film 15 illustrated in FIG. 21 can be achieved such that the respective conditions are regulated, such as the film-forming conditions when forming the polysilicon film on the entire surface by the CVD method or the like or the etching conditions when partly removing the polysilicon film by dry etching or wet etching.

Figure 22:
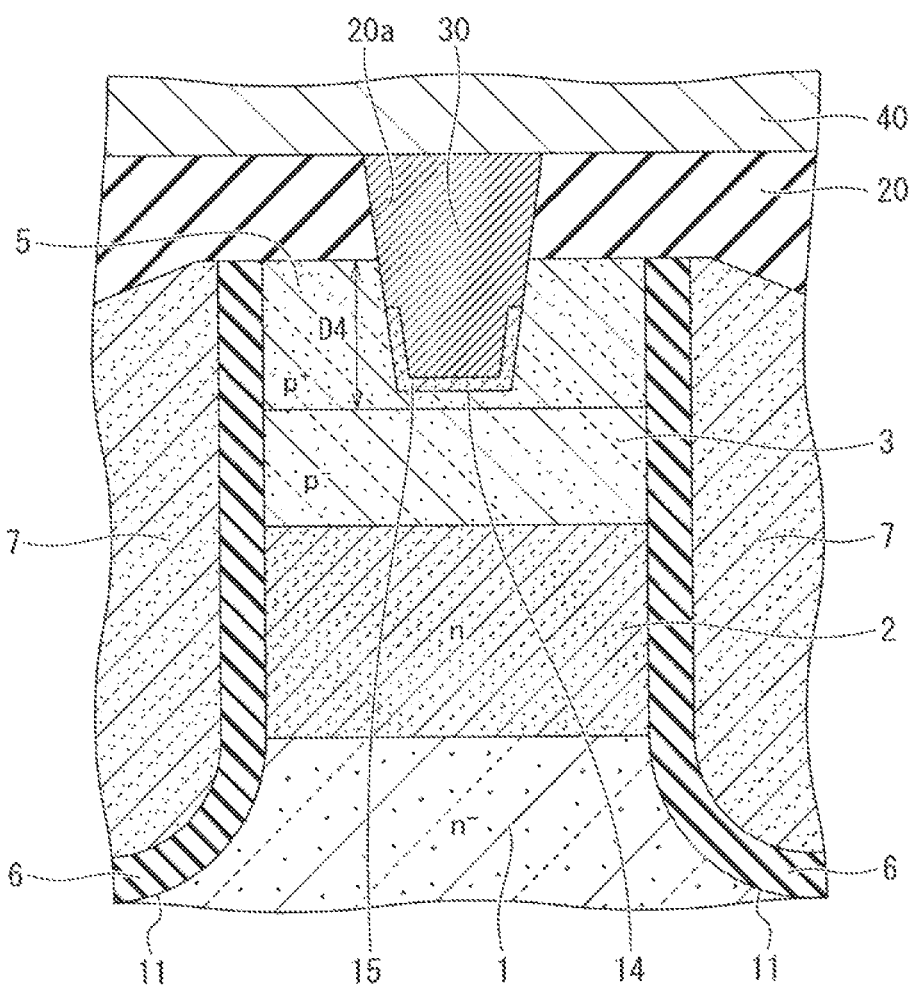
FIG. 22 is another vertical cross-sectional view illustrating the example of the semiconductor device according to the fourth embodiment.

FIG. 22 is a cross-sectional view illustrating the semiconductor device according to the fourth embodiment in which the contact region 5 appears, and corresponds to the cross-sectional view of the semiconductor device according to the first embodiment illustrated in FIG. 4. As illustrated in FIG. 22, the depth D4 of the contact region 5 is greater than the depth D3 of the emitter regions 4a and 4b and the depth D1 of the respective contact trenches 14 illustrated in FIG. 21. The bottom surface of the respective contact trenches 14 is located inside the contact region 5. The polysilicon film 15 is in contact with the contact region 5. The depth D4 of the contact region 5 may be shallower than the depth D1 of the respective contact trenches 14 illustrated in FIG. 21. The polysilicon film 15 in such a case only needs to be in contact with the contact region 5 along the respective side surfaces of the contact trenches 14. The other configurations of the semiconductor device according to the fourth embodiment are the same as those of the semiconductor device according to the first embodiment, and overlapping explanations are not repeated below.

The semiconductor device according to the fourth embodiment, which has the configuration in which the polysilicon film 15 buried in the respective contact trenches 14 has the substantially U-like shape in cross section, can also avoid a variation in the gate threshold voltage derived from the wafer process. Further, since the ohmic contact area between the polysilicon film 15 and the contact part 30 is larger, the contact resistance can be decreased more effectively.

Fifth Embodiment

Figure 23:
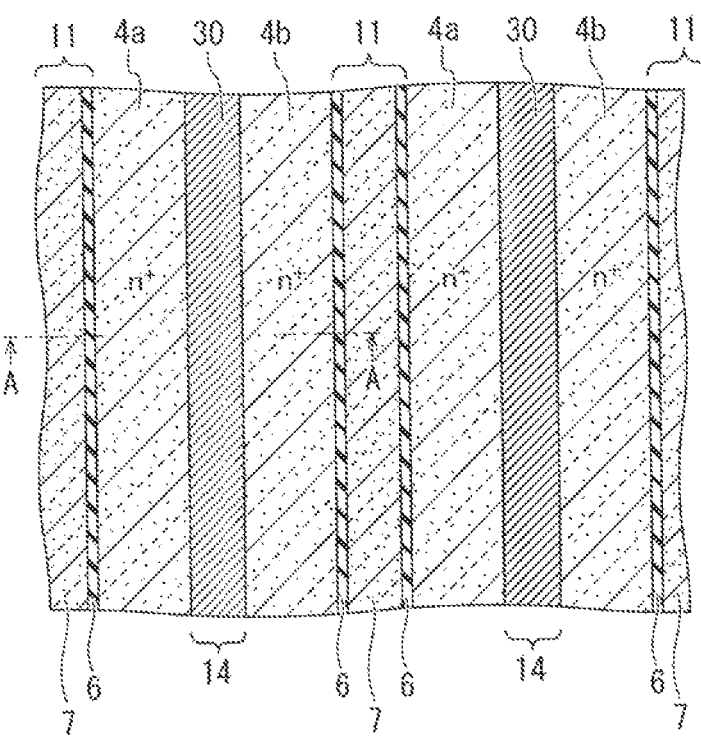
FIG. 23 is a horizontal cross-sectional view illustrating an example of a semiconductor device according to a fifth embodiment.

FIG. 23 is a horizontal cross-sectional view illustrating a semiconductor device according to a fifth embodiment, and corresponds to the horizontal cross-sectional view of the semiconductor device according to the first embodiment illustrated in FIG. 1. As illustrated in FIG. 23, the semiconductor device according to the fifth embodiment differs from the semiconductor device according to the first embodiment in that the emitter regions 4a and 4b each have a part extending in a stripe-shaped pattern in a direction parallel to the extending direction of the gate trenches 11 and the contact trenches 14. The gate trench 11, the emitter region 4a, the contact trench 14, and the emitter region 4b are repeatedly arranged parallel to each other in a direction perpendicular to the extending direction of the gate trenches 11 and the contact trenches 14.

Figure 24:
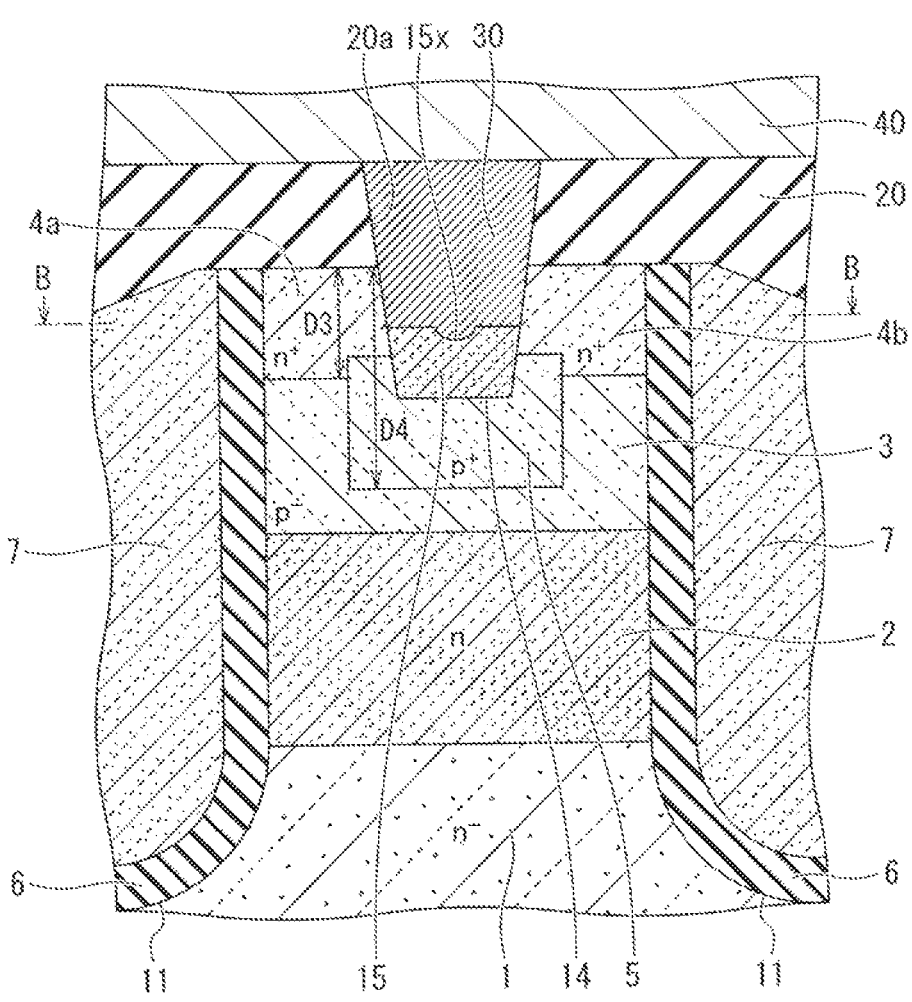
FIG. 24 is a vertical cross-sectional view as viewed from direction A-A in FIG. 23.

FIG. 24 is a view illustrating a part of the vertical cross section as viewed from direction A-A in FIG. 23. The horizontal cross section as viewed from direction B-B in FIG. 24 corresponds to FIG. 23. As illustrated in FIG. 24, the respective emitter regions 4a and 4b and the contact region 5 are provided at the upper part of the base region 3. The emitter regions 4a and 4b are arranged to interpose the contact region 5. The depth D3 of the emitter regions 4a and 4b is shallower than the depth D4 of the contact region 5.

The emitter regions 4a and 4b are in contact with the respective side walls of the contact trench 14 so as to be in contact with the polysilicon film 15 buried in the contact trench 14 and the contact part 30 in the contact hole 20a. Alternatively, the emitter regions 4a and 4b may only be in contact with the contact part 30 in the contact hole 20a without being in contact with the polysilicon film 15.

The contact region 5 is deposited on the bottom surface side of the emitter regions 4a and 4b and the respective contact trenches 14. The contact region 5 is provided to cover the side walls and the bottom of the respective contact trenches 14 so as to be in contact with the polysilicon film 15. The contact region 5 is arranged in a stripe state parallel to the extending direction of the gate trenches 11 and the contact trenches 14.

The respective contact trenches 14 are provided at the upper part of the contact region 5. The side walls and the bottom surface of the respective contact trenches 14 are in contact with the contact region 5. The polysilicon film 15 is buried in the lower part of the respective contact trenches 14. The top surface of the polysilicon film 15 in the middle is provided with the recess 15x. The side surfaces and the bottom surface of the polysilicon film 15 are in contact with the contact region 5. The contact part 30 is in ohmic contact with the polysilicon film 15. The contact region 5 may be arranged selectively in the direction parallel to the extending direction of the gate trenches 11 and the contact trenches 14. The other configurations of the semiconductor device according to the fifth embodiment are the same as those of the semiconductor device according to the first embodiment, and overlapping explanations are not repeated below.

The semiconductor device according to the fifth embodiment, which differs from the semiconductor device according to the first embodiment in the arrangement of the respective emitter regions 4a and 4b and the contact region 5, can also lead the polysilicon film 15 to be in ohmic contact with the contact part 30 due to the deposition of the polysilicon film 15 in the respective contact trenches 14. This configuration can decrease the width and the depth of the $p^+$-type contact region 5 in contact with the respective contact trenches 14 upon the formation of the contact region 5 by the implantation of the p-type impurity ions into the bottom surface of the respective contact trenches 14, as compared with the case of not being provided with the polysilicon film 15, so as to avoid a variation in the gate threshold voltage derived from the wafer process.

Sixth Embodiment

Figure 25:
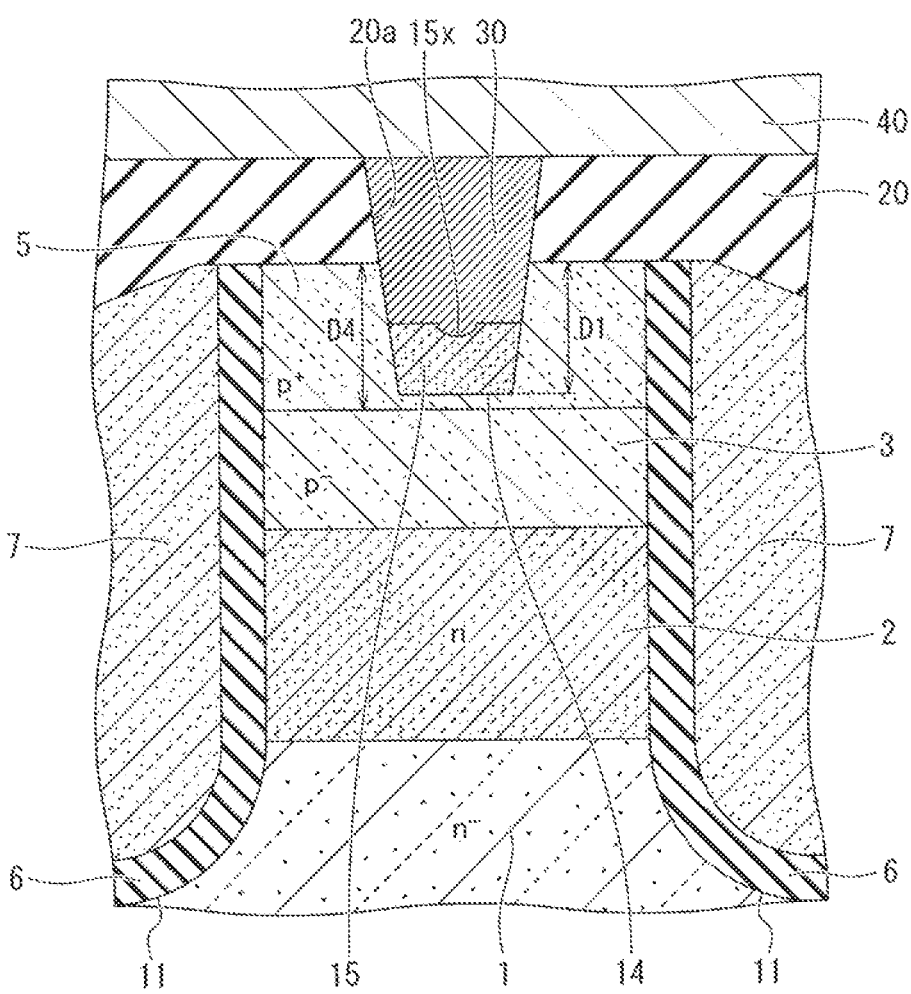
FIG. 25 is a vertical cross-sectional view illustrating an example of a semiconductor device according to a sixth embodiment.

FIG. 25 is a cross-sectional view illustrating a semiconductor device according to a sixth embodiment in which the contact region 5 appears, and corresponds to the cross-sectional view of the semiconductor device according to the first embodiment illustrated in FIG. 4. The cross section in which the emitter regions 4a and 4b in the semiconductor device according to the sixth embodiment appear conforms to that illustrated in FIG. 3. As illustrated in FIG. 25, the semiconductor device according to the sixth embodiment differs from the semiconductor device according to the first embodiment in that the depth D4 of the contact region 5 is greater than the depth D4 of the contact region 5 illustrated in FIG. 4, and is also greater than the depth D1 of the respective contact trenches 14.

The depth D4 of the contact region 5 can be adjusted such that an acceleration voltage upon the ion implantation for forming the contact region 5 is regulated. The bottom surface of the respective contact trenches 14 is located inside the contact region 5. The side surfaces and the bottom surface of the polysilicon film 15 buried in the respective contact trenches 14 are in contact with the contact region 5. The other configurations of the semiconductor device according to the sixth embodiment are the same as those of the semiconductor device according to the first embodiment, and overlapping explanations are not repeated below.

The semiconductor device according to the sixth embodiment, which has the configuration in which the depth D3 of the emitter regions 4a and 4b is shallower than the depth D1 of the respective contact trenches 14 as illustrated in FIG. 3, and the depth D4 of the contact region 5 is greater than the depth D1 of the respective contact trenches 14 as illustrated in FIG. 25, can also avoid a variation in the gate threshold voltage derived from the wafer process.

Seventh Embodiment

Figure 26:
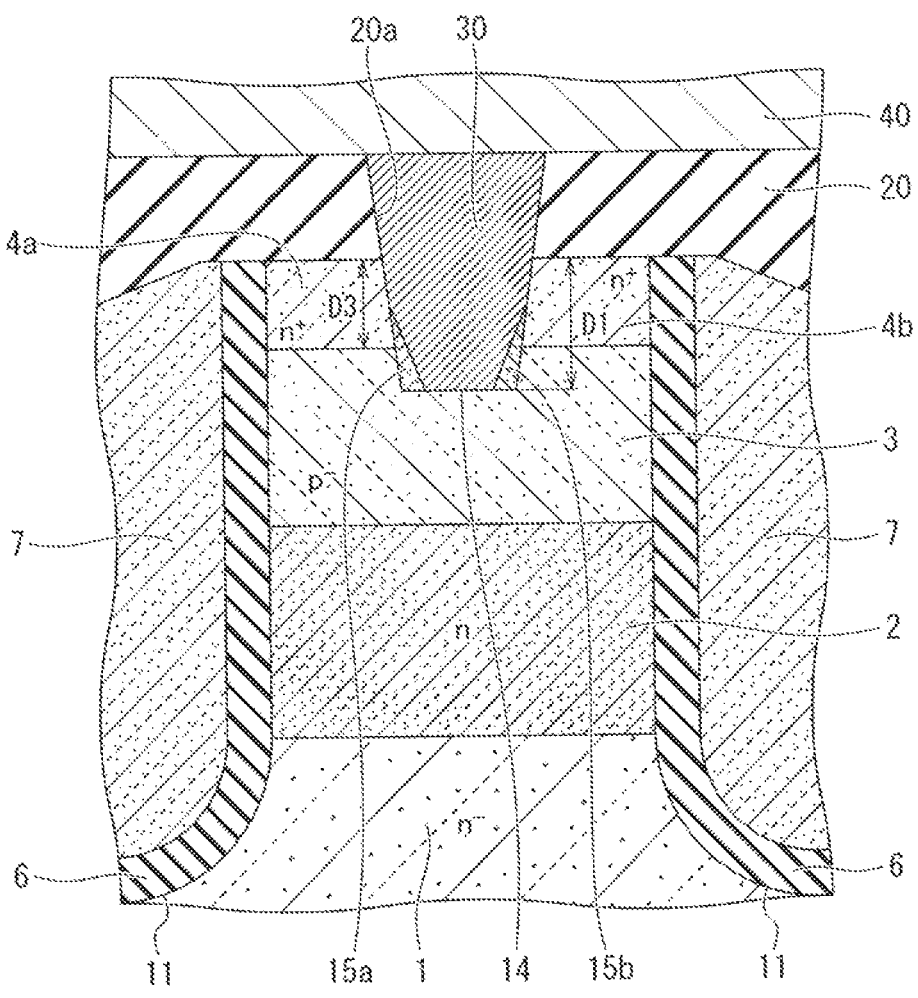
FIG. 26 is a vertical cross-sectional view illustrating an example of a semiconductor device according to a seventh embodiment.

FIG. 26 is a cross-sectional view illustrating a semiconductor device according to a seventh embodiment in which the emitter regions 4a and 4b appear, and corresponds to the cross-sectional view of the semiconductor device according to the first embodiment illustrated in FIG. 3. As illustrated in FIG. 26, the semiconductor device according to the seventh embodiment differs from the semiconductor device according to the first embodiment in that the polysilicon films 15a and 15b are selectively deposited at the corners defined by the side surfaces and the bottom surface of the respective contact trenches 14.

The shape of the polysilicon films 15a and 15b illustrated in FIG. 26 can be achieved such that the respective conditions are regulated, such as the film-forming conditions when forming the polysilicon film on the entire surface by the CVD method or the like or the etching conditions when partly removing the polysilicon film by dry etching or wet etching. The middle of the bottom surface of the respective contact trenches 14 may be hollowed by over etching so as to be provided with a recess.

The polysilicon film 15a is in contact with the emitter region 4a and the base region 3. The polysilicon film 15b is in contact with the emitter region 4b and the base region 3. The polysilicon films 15a and 15b are located separately from each other. The contact part 30 is interposed between the respective polysilicon films 15a and 15b. The bottom surface of the contact part 30 is in contact with the base region 3. The depth D3 of the emitter regions 4a and 4b is shallower than the depth D1 of the respective contact trenches 14. The depth D3 of the emitter regions 4a and 4b may be either the same as or greater than the depth D1 of the respective contact trenches 14.

Figure 27:
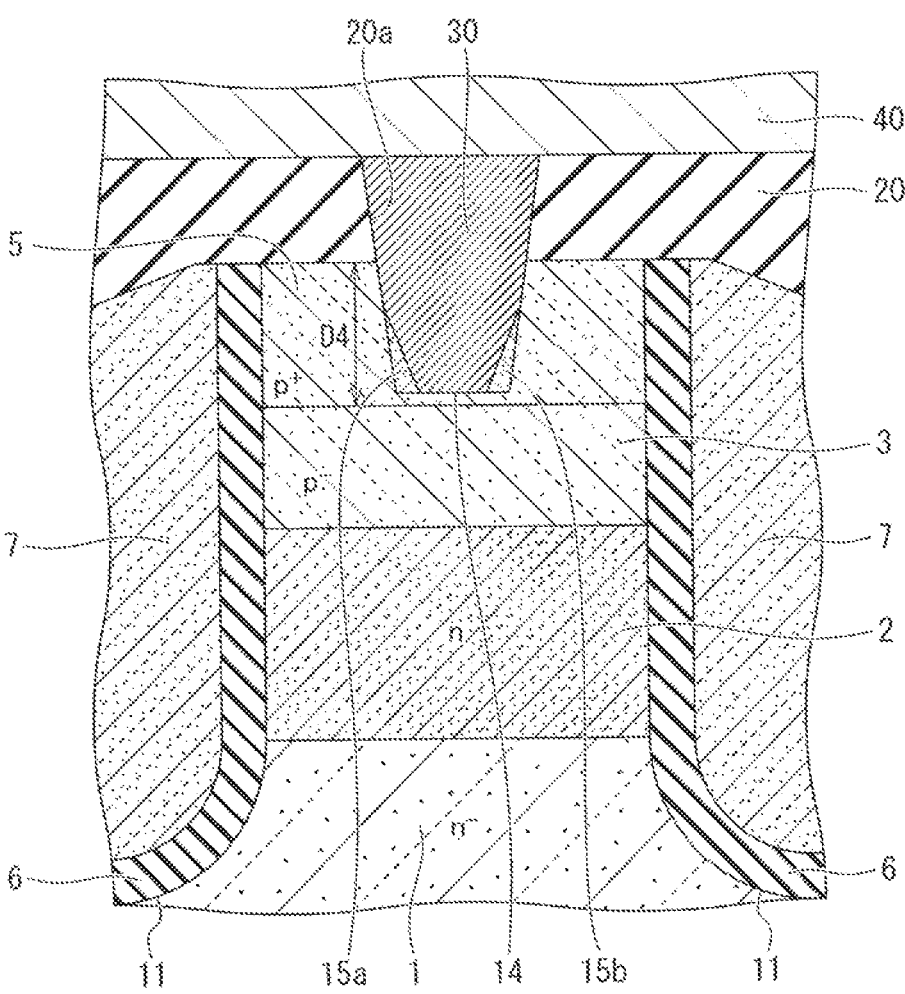
FIG. 27 is another vertical cross-sectional view illustrating the example of the semiconductor device according to the seventh embodiment.

FIG. 27 is a cross-sectional view illustrating the semiconductor device according to the seventh embodiment in which the contact region 5 appears, and corresponds to the cross-sectional view of the semiconductor device according to the first embodiment illustrated in FIG. 4. As illustrated in FIG. 27, the depth D4 of the contact region 5 is greater than the depth D3 of the emitter regions 4a and 4b and the depth D1 of the respective contact trenches 14 illustrated in FIG. 21. The depth D4 of the contact region 5 may be either the same as or shallower than the depth D1 of the respective contact trenches 14. The bottom surface of the respective contact trenches 14 is located inside the contact region 5. The respective polysilicon films 15a and 15b are in contact with the contact region 5. The bottom surface of the contact part 30 located between the respective polysilicon films 15a and 15b is in contact with the base region 3. The other configurations of the semiconductor device according to the seventh embodiment are the same as those of the semiconductor device according to the first embodiment, and overlapping explanations are not repeated below.

The semiconductor device according to the seventh embodiment, which has the configuration in which the polysilicon films 15a and 15b are located selectively at the corners defined by the side surfaces and the bottom surface of the respective contact trenches 14, can also avoid a variation in the gate threshold voltage derived from the wafer process.

Eighth Embodiment

Figure 28:
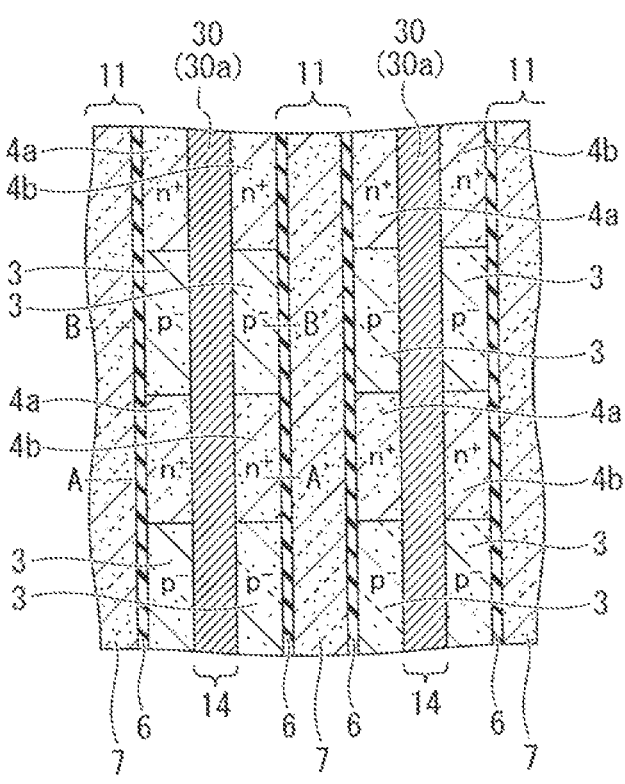
FIG. 28 is a horizontal cross-sectional view illustrating an example of a semiconductor device according to an eighth embodiment.
Figure 29:
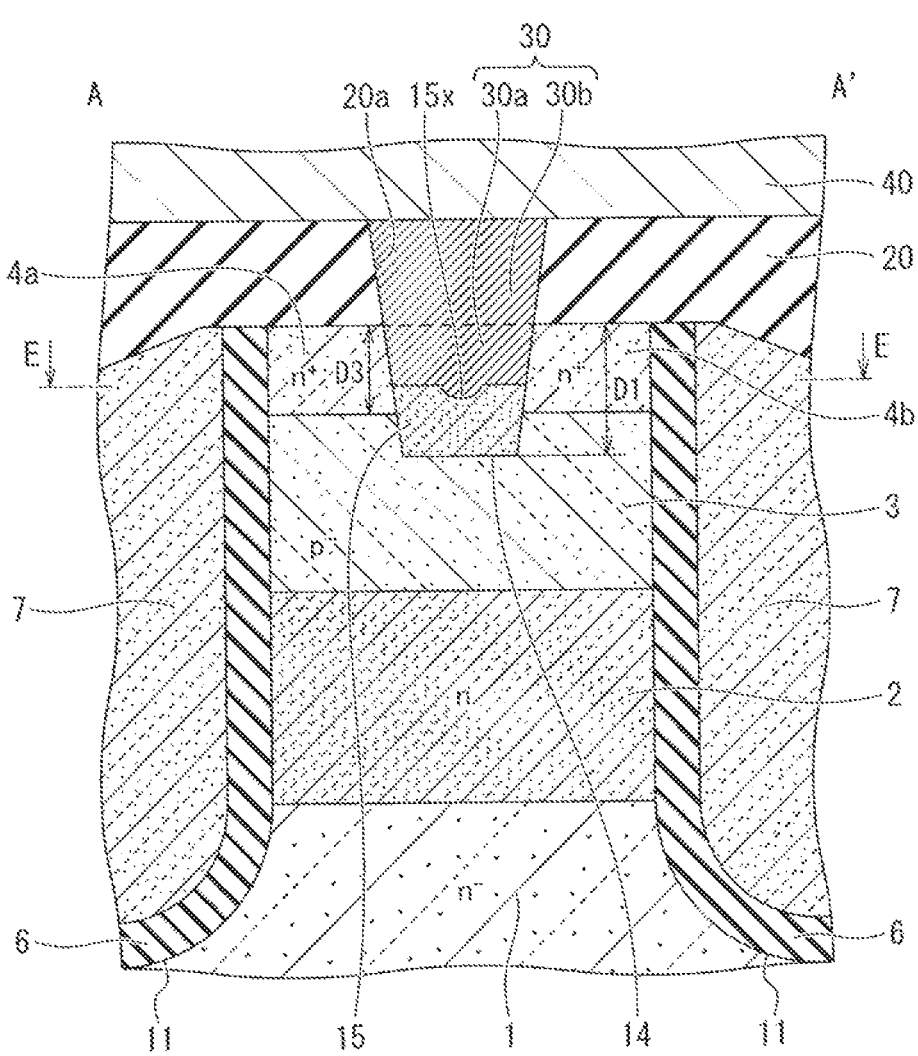
FIG. 29 is a vertical cross-sectional view taken along line A-A' in FIG. 28.

FIG. 28 is a horizontal cross-sectional view illustrating a semiconductor device according to an eighth embodiment. FIG. 29 is a vertical cross-sectional view taken along line A-A' in FIG. 28. The horizontal cross section as viewed from direction E-E in FIG. 29 corresponds to FIG. 28. As illustrated in FIG. 28, the semiconductor device according to the eighth embodiment differs from the semiconductor device according to the first embodiment illustrated in FIG. 1 in that the respective emitter regions 4a and 4b and the base region 3 are alternately and repeatedly arranged parallel to the extending direction of the gate trenches 11 and the contact trenches 14. The semiconductor device according to the eighth embodiment is not provided with the p$^+$-type contact region on the top surface side of the base region 3.

As illustrated in FIG. 29, the respective emitter regions 4a and 4b are arranged on the top surface side of the base region 3. The respective contact trenches 14 are provided to penetrate the emitter regions 4a and 4b so as to reach the base region 3. The bottom surface of the respective contact trenches 14 is located at a position deeper than the top surface of the base region 3. The bottom surface of the respective contact trenches 14 may be located at the same level as the top surface of the base region 3 instead. The respective contact trenches 14 do not necessarily penetrate the emitter regions 4a and 4b but may be located inside the emitter regions 4a and 4b instead. The bottom surface of the respective contact trenches 14 in such a case may be located at a position shallower than the top surface of the base region 3.

The p$^+$-type polysilicon film 15 having a higher impurity concentration than the base region 3 is buried in the lower part of the respective contact trenches 14. The top surface of the polysilicon film 15 is provided with the recess 15x in the middle. The bottom surface of the polysilicon film 15 is in contact with the base region 3. The side surfaces of the polysilicon film 15 are in contact with the base region 3 and the respective emitter regions 4a and 4b.

The contact part 30 is provided at the upper part of the contact trench 14 and in the contact hole 20a of the interlayer insulating film 20. The contact part 30 includes a buried part 30a and a plug part 30b. The buried part 30a and the plug part 30b may be integrated with each other, or may be provided separately from each other. The buried part 30a corresponds to the lower part of the contact part 30 to be buried in the respective contact trenches 14. The buried part 30a is in ohmic contact with the polysilicon film 15. The plug part 30b corresponds to the upper part of the contact part 30 to be provided in the contact hole 20a.

Figure 30:
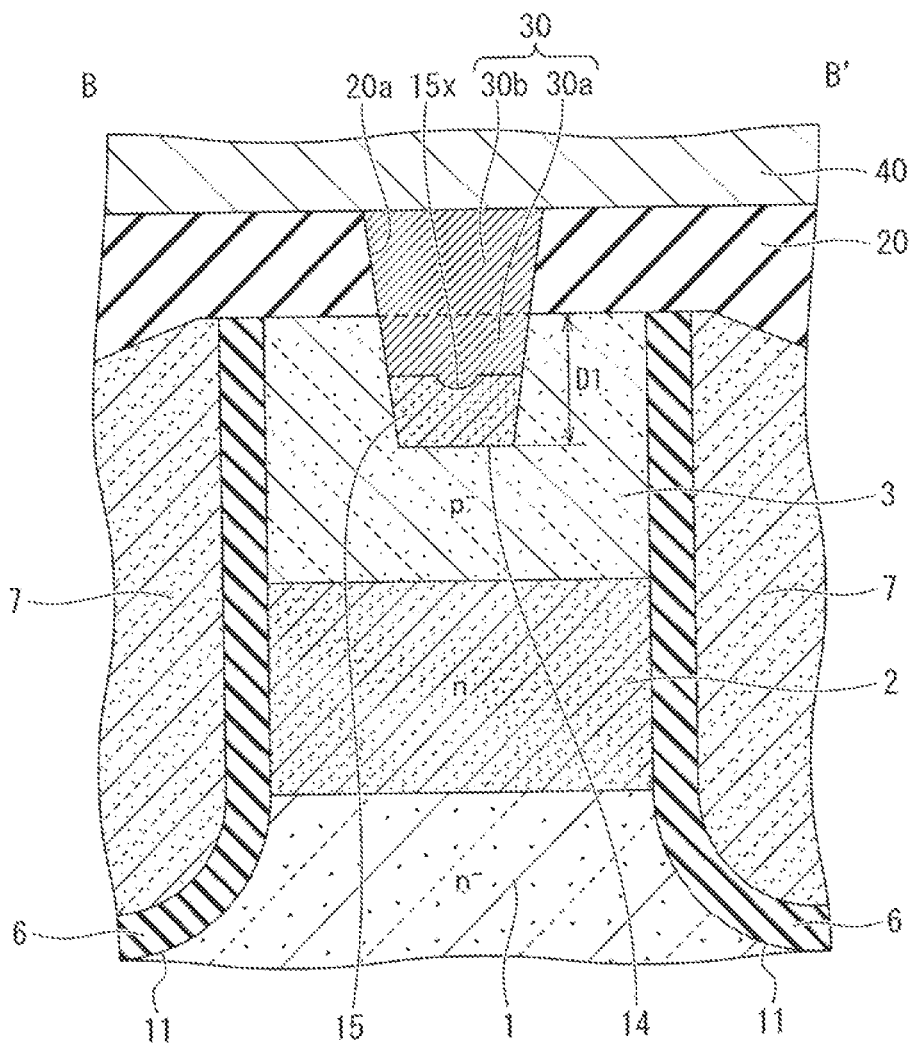
FIG. 30 is a vertical cross-sectional view taken along line B-B' in FIG. 28.

FIG. 30 is a vertical cross-sectional view taken along line B-B' in FIG. 28. As illustrated in FIG. 30, the interlayer insulating film 20 is deposited on the top surface of the base region 3. The respective contact trenches 14 are provided at the upper part of the base region 3. The polysilicon film 15 is buried in the lower part of the respective contact trenches 14. The buried part 30a of the contact part 30 is buried in the upper part of the respective contact trenches 14. The buried part 30a is in ohmic contact with the polysilicon film 15. The plug part 30b of the contact part 30 is provided in the contact hole 20a of the interlayer insulating film 20. The other configurations of the semiconductor device according to the eighth embodiment are the same as those of the semiconductor device according to the first embodiment, and overlapping explanations are not repeated below.

The semiconductor device according to the eighth embodiment, which has the configuration not including the p$^+$-type contact region on the top surface side of the base region 3, can also lead the polysilicon film 15 to be in ohmic contact with the contact part 30. Since the implantation of the p-type impurity ions into the bottom surface of the respective contact trenches 14 does not need to be executed, the p-type impurity ions such as boron (B) can be prevented from being diffused toward silicon (Si) in the mesa part between the respective gate trenches 11 next to each other under the conditions in which the long heat treatment such as reflow is not executed, so as to have no influence on the gate threshold. This configuration thus can avoid a variation in the gate threshold voltage derived from the wafer process.

Ninth Embodiment

Figure 31:
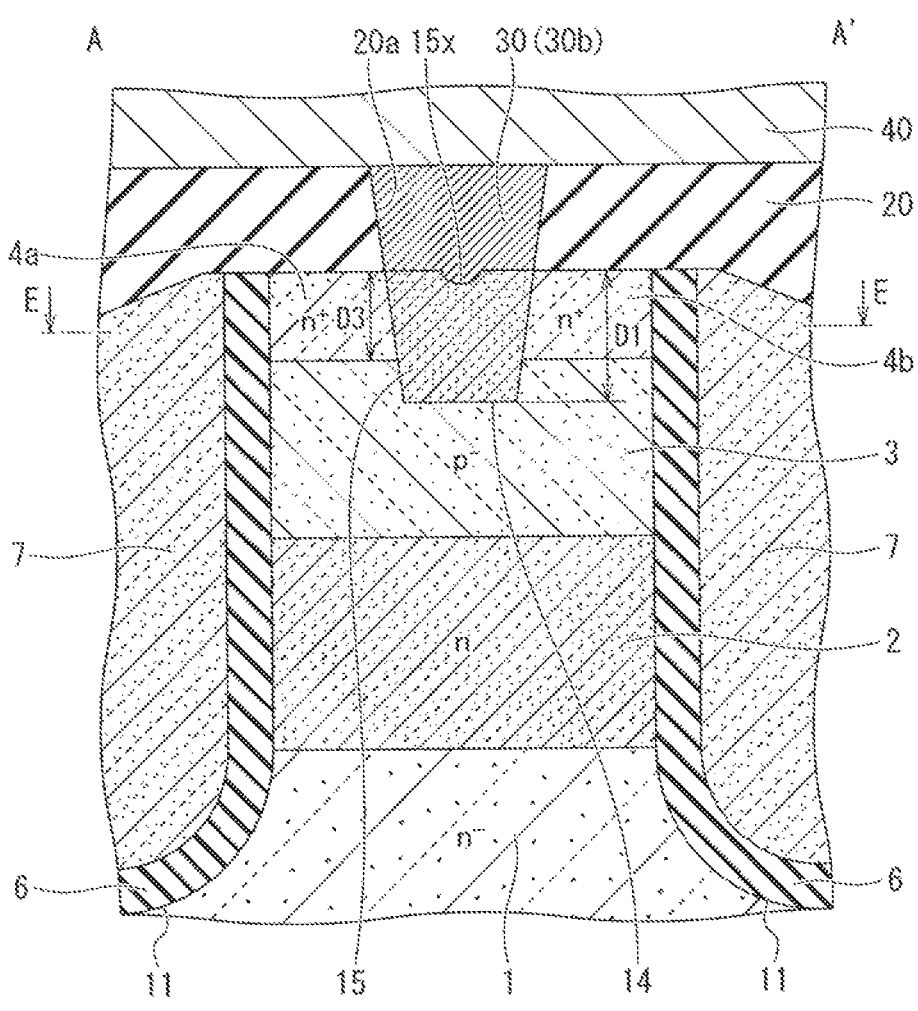
FIG. 31 is a vertical cross-sectional view illustrating an example of a semiconductor device according to a ninth embodiment.

A horizontal cross section of a semiconductor device according to a ninth embodiment differs from the horizontal cross section of the semiconductor device according to the eighth embodiment illustrated in FIG. 28 in that the polysilicon film 15 is provided instead of the buried part 30a. FIG. 31 is a vertical cross-sectional view illustrating the semiconductor device according to the ninth embodiment taken along line A-A' in FIG. 28. As illustrated in FIG. 31, the semiconductor device according to the ninth embodiment differs from the semiconductor device according to the eighth embodiment illustrated in FIG. 29 in that the polysilicon film 15 is buried to reach the upper part of the respective contact trenches 14.

The height of the top surface of the polysilicon film 15 substantially conforms to the height of the top surface of the respective emitter regions 4a and 4b. The polysilicon film 15 may be deposited further up to the middle of the contact hole 20a of the interlayer insulating film 20. In such a case, the top surface of the polysilicon film 15 may be located at a position higher than the top surface of the respective emitter regions 4a and 4b.

The contact part 30 only includes the plug part 30b provided in the contact hole 20a of the interlayer insulating film 20 without including the buried part 30a buried in the respective contact trenches 14. The plug part 30b is in ohmic contact with the polysilicon film 15.

Figure 32:
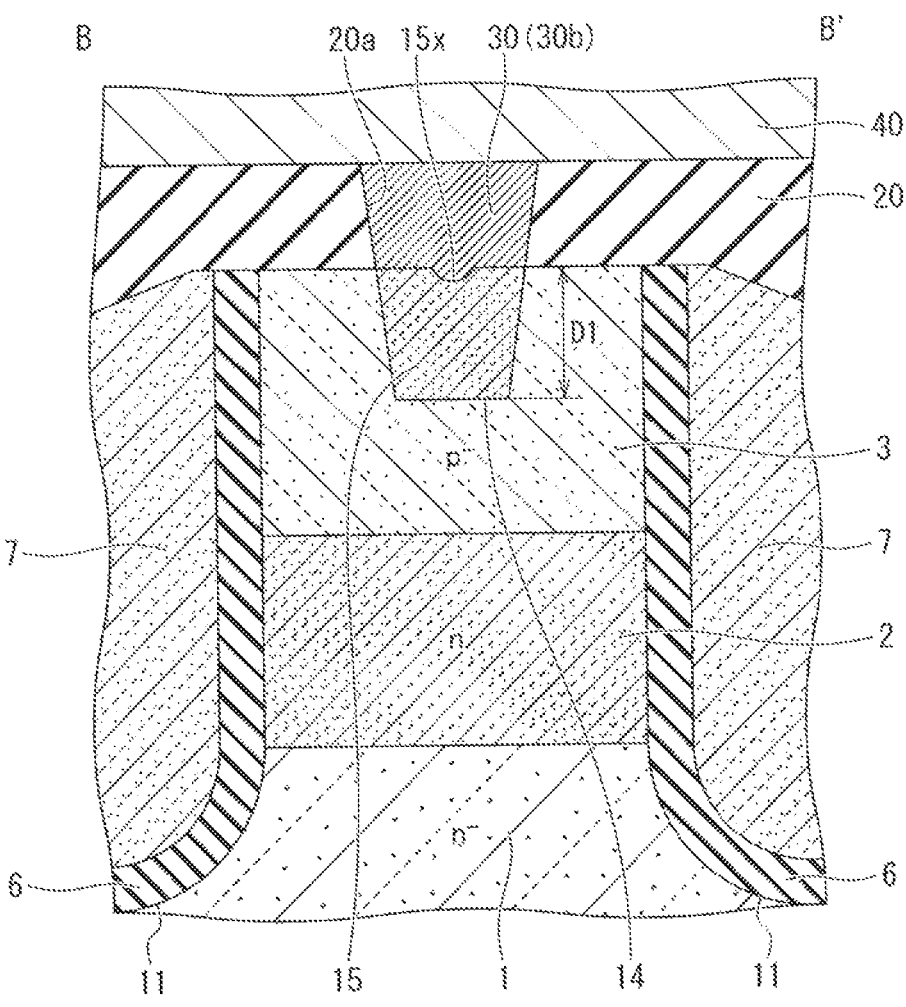
FIG. 32 is another vertical cross-sectional view illustrating the example of the semiconductor device according to the ninth embodiment.

FIG. 32 is a vertical cross-sectional view illustrating the semiconductor device according to the ninth embodiment taken along line B-B' in FIG. 28. The semiconductor device according to the ninth embodiment differs from the semiconductor device according to the eighth embodiment illustrated in FIG. 30 in that the polysilicon film 15 is buried to reach the upper part of the respective contact trenches 14.

The contact part 30 only includes the plug part 30b provided in the contact hole 20a of the interlayer insulating film 20 without including the buried part 30a buried in the respective contact trenches 14. The plug part 30b is in ohmic contact with the polysilicon film 15. The other configurations of the semiconductor device according to the ninth embodiment are the same as those of the semiconductor device according to the eighth embodiment, and overlapping explanations are not repeated below.

The semiconductor device according to the ninth embodiment having the configuration in which the polysilicon film 15 is deposited up to the upper part of the respective contact trenches 14, can also lead the polysilicon film 15 to be in ohmic contact with the plug part 30b of the contact part 30. The present embodiment thus does not need to execute the implantation of the p-type impurity ions into the bottom surface of the respective contact trenches 14, so as to avoid a variation in the gate threshold voltage derived from the wafer process.

Tenth Embodiment

Figure 33:
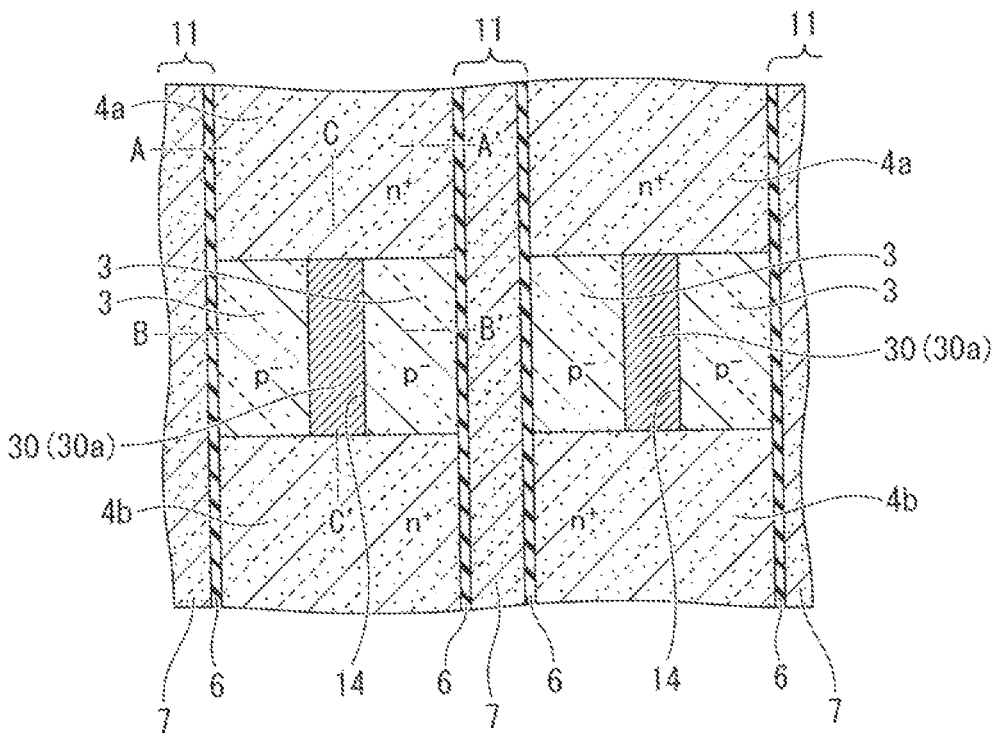
FIG. 33 is a horizontal cross-sectional view illustrating an example of a semiconductor device according to a tenth embodiment.
Figure 34:
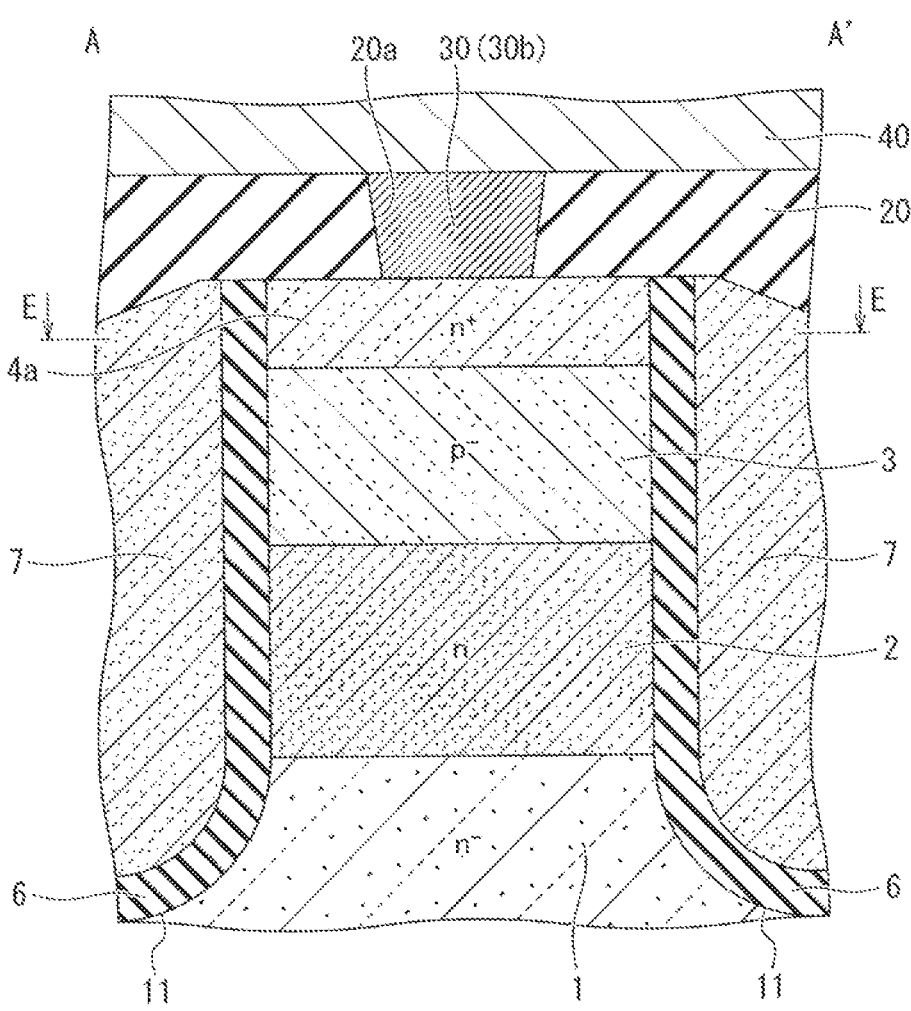
FIG. 34 is a vertical cross-sectional view taken along line A-A' in FIG. 33.

FIG. 33 is a horizontal cross-sectional view illustrating a semiconductor device according to a tenth embodiment. FIG. 34 is a vertical cross-sectional view illustrating the semiconductor device according to the tenth embodiment taken along line A-A' in FIG. 33. The horizontal cross section as viewed from direction E-E in FIG. 34 corresponds to FIG. 33. As illustrated in FIG. 33, the semiconductor device according to the tenth embodiment has a configuration common to that of the semiconductor device according to the eighth embodiment illustrated in FIG. 28 in that the emitter regions 4a and 4b and the base region 3 are alternately and repeatedly arranged parallel to the extending direction of the respective gate trenches 11. The semiconductor device according to the tenth embodiment differs from the semiconductor device according to the eighth embodiment in that the respective contact trenches 14 are provided intermittently in the extending direction of the respective gate trenches 11.

The contact trenches 14 are not provided in the emitter regions 4a and 4b. The emitter regions 4a and 4b are intermittently arranged in the extending direction of the respective gate trenches 11. The emitter regions 4a and 4b are interposed between the respective gate trenches 11 adjacent to each other in the direction perpendicular to the extending direction of the gate trenches 11.

The respective contact trenches 14 are selectively provided only in the base region 3. The respective contact trenches 14 are arranged across the both ends of the base region 3 so as to extend in the longitudinal direction corresponding to the extending direction of the gate trenches 11. The contact trenches 14 may be provided partly on the inside of the both ends of the base region 3. The respective contact trenches 14 may be arranged across the both ends of the base region 3 to further extend toward a part of the respective emitter regions 4a and 4b.

As illustrated in FIG. 34, the emitter region 4a is provided on the top surface side of the base region 3. The interlayer insulating film 20 is further deposited on the top surface of the emitter region 4a. The plug part 30b of the contact part 30 is provided in the contact hole 20a of the interlayer insulating film 20. The bottom surface of the plug part 30b is in contact with the top surface of the emitter region 4a.

The vertical cross section of the semiconductor device according to the tenth embodiment taken along line B-B' in FIG. 33 is common to the vertical cross section of the semiconductor device according to the eighth embodiment illustrated in FIG. 30. The width of the contact hole 20a of the interlayer insulating film 20 illustrated in FIG. 30 at a position at which the emitter regions 4a and 4b are not provided may be set to be greater than the width of the contact hole 20*a* of the interlayer insulating film 20 illustrated in FIG. 34 at a position at which the emitter regions 4*a* and 4*b* are provided.

Figure 35:
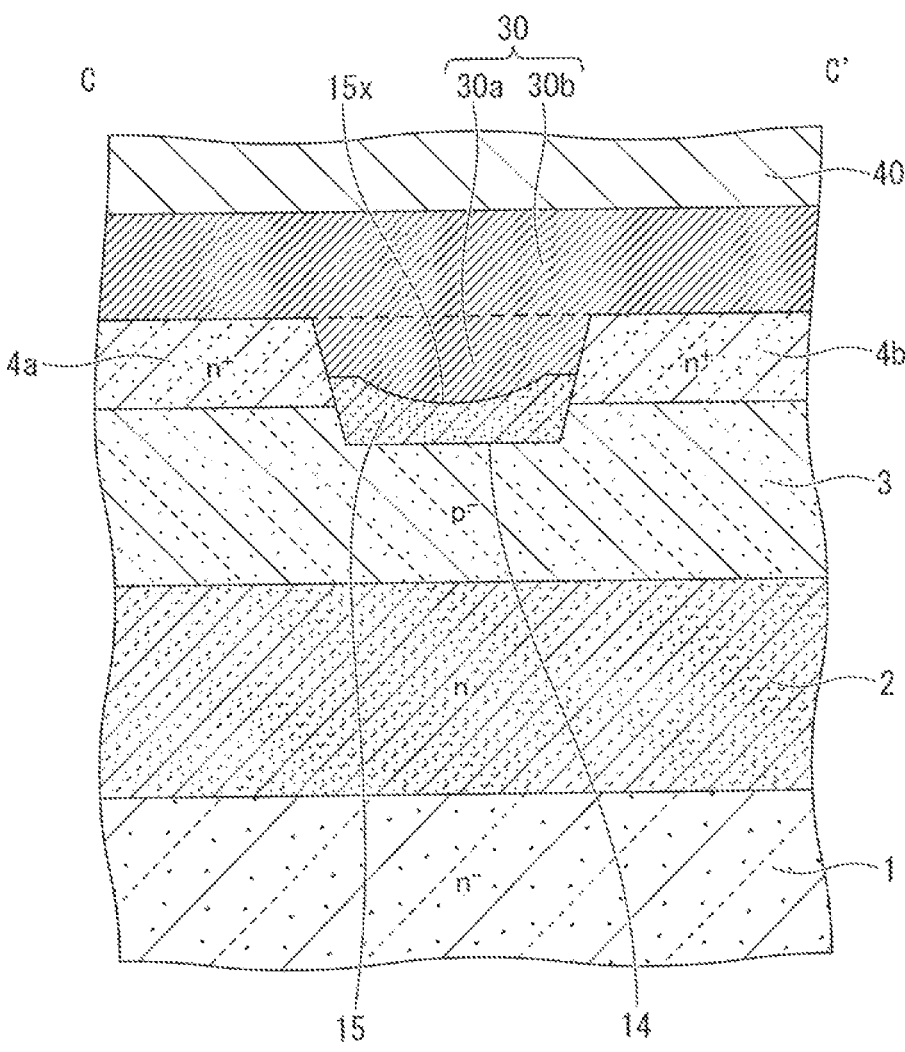
FIG. 35 is a vertical cross-sectional view taken along line C-C' in FIG. 33.

FIG. 35 is a vertical cross-sectional view illustrating the semiconductor device according to the tenth embodiment taken along line C-C' in FIG. 33. As illustrated in FIG. 35, the respective emitter regions 4*a* and 4*b* are provided on the top surface side of the base region 3. The plug part 30*b* of the contact part 30 is deposited on the top surface of the respective emitter regions 4*a* and 4*b*. The respective contact trenches 14 are provided so as to penetrate the emitter regions 4*a* and 4*b* to reach the base region 3. The polysilicon film 15 is deposited in the lower part of the respective contact trenches 14. The buried part 30*a* of the contact part 30 is provided at the upper part of the respective contact trenches 14. The buried part 30*a* is in ohmic contact with the polysilicon film 15. The top surface of the polysilicon film 15 in the middle is not necessarily provided with the recess 15*x*, but may be a flat surface instead. The other configurations of the semiconductor device according to the tenth embodiment are the same as those of the semiconductor device according to the eighth embodiment, and overlapping explanations are not repeated below.

The semiconductor device according to the tenth embodiment having the configuration in which the contact trenches 14 are intermittently provided in the base region 3 can also lead the polysilicon film 15 to be in ohmic contact with the contact part 30. The present embodiment thus does not need to execute the implantation of the p-type impurity ions into the bottom surface of the respective contact trenches 14, so as to avoid a variation in the gate threshold voltage derived from the wafer process.

Eleventh Embodiment

A horizontal cross section of a semiconductor device according to an eleventh embodiment is common to the horizontal cross section of the semiconductor device according to the tenth embodiment illustrated in FIG. 33. A vertical cross section of the semiconductor device according to the eleventh embodiment taken along line A-A' in FIG. 33 is common to the vertical cross section of the semiconductor device according to the tenth embodiment illustrated in FIG. 34.

Figure 36:
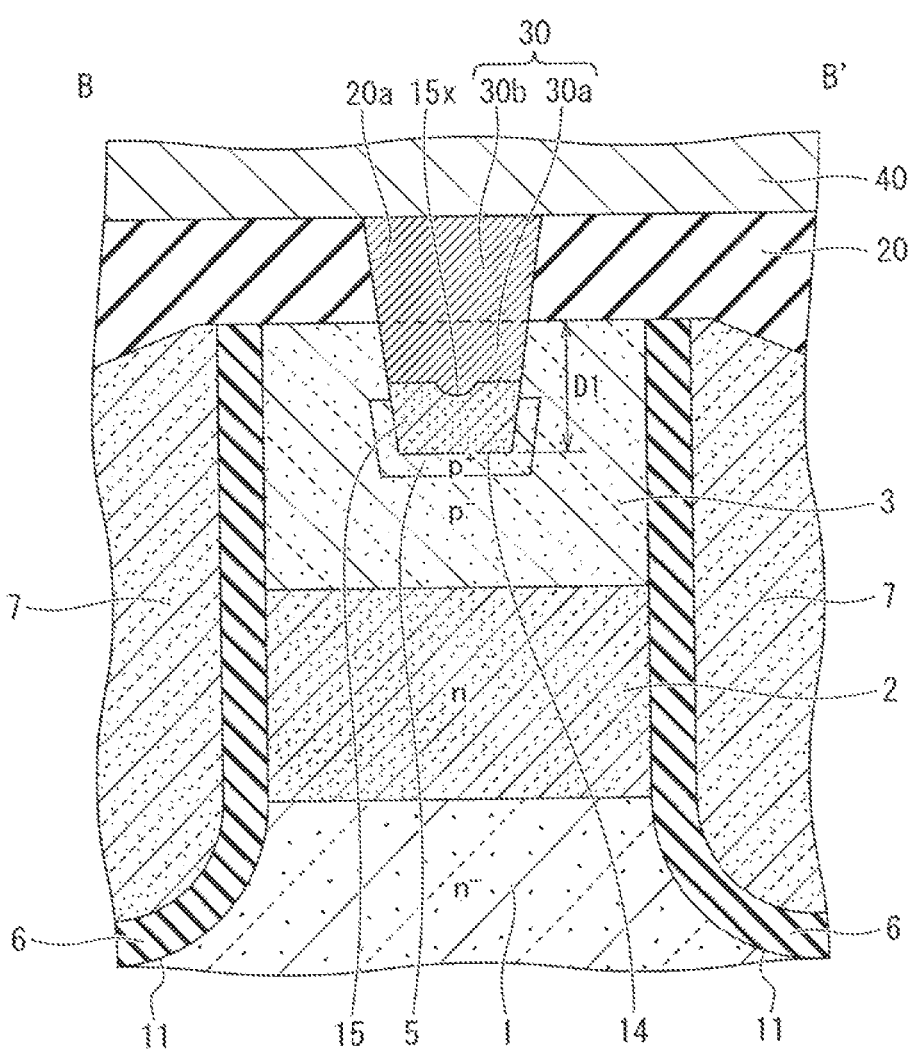
FIG. 36 is a vertical cross-sectional view illustrating an example of a semiconductor device according to an eleventh embodiment.

FIG. 36 is a vertical cross-sectional view illustrating the semiconductor device according to the eleventh embodiment taken along line B-B' in FIG. 33. As illustrated in FIG. 36, the semiconductor device according to the eleventh embodiment differs from the semiconductor device according to the tenth embodiment illustrated in FIG. 30 in that the p$^+$-type contact region 5 is provided to be in contact with the bottom surface and the side surfaces of the respective contact trenches 14. The contact region 5 may be in contact with only the bottom surface of the respective contact trenches 14 without being in contact with the side surfaces of the respective contact trenches 14 instead. The contact region 5 is in contact with the polysilicon film 15.

Figure 37:
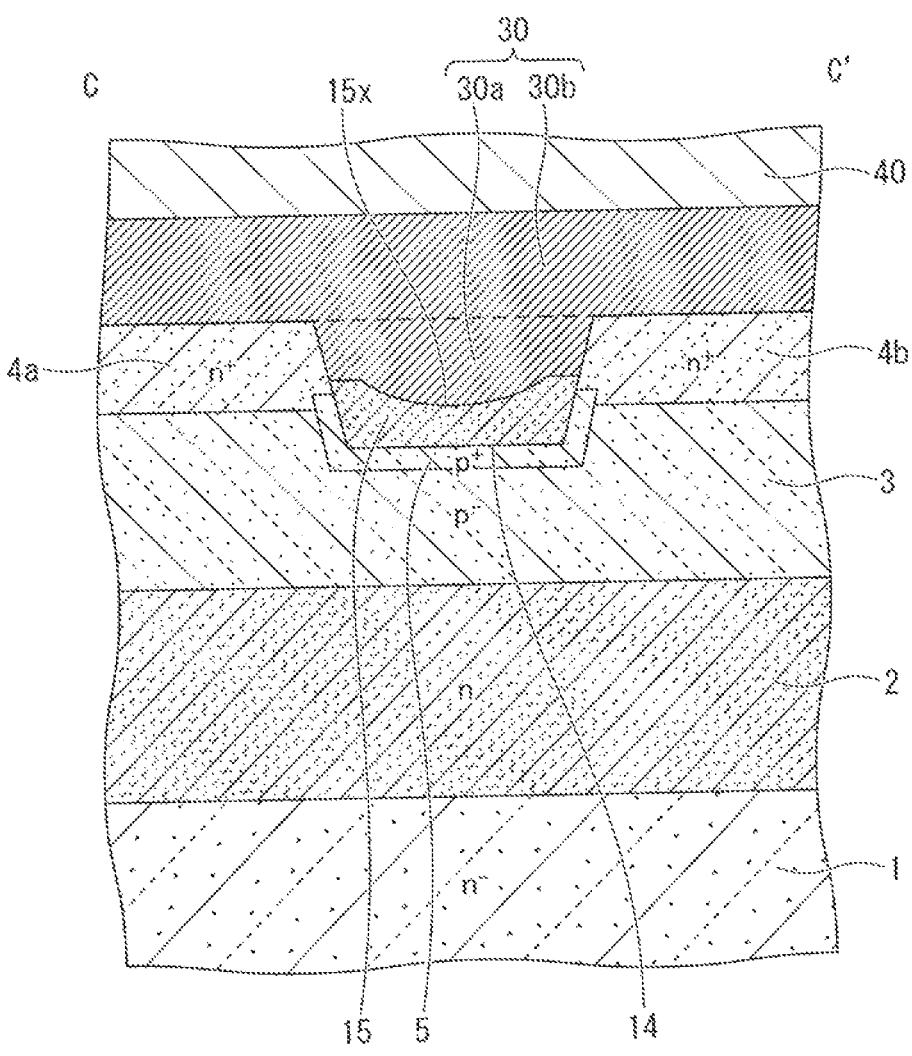
FIG. 37 is another vertical cross-sectional view illustrating the example of the semiconductor device according to the eleventh embodiment.

FIG. 37 is a vertical cross-sectional view illustrating the semiconductor device according to the eleventh embodiment taken along line C-C' in FIG. 33. As illustrated in FIG. 37, the semiconductor device according to the eleventh embodiment differs from the semiconductor device according to the tenth embodiment illustrated in FIG. 35 in that the p$^+$-type contact region 5 is provided to be in contact with the bottom surface and the side surfaces of the respective contact trenches 14. The contact region 5 may be in contact with only the bottom surface of the respective contact trenches 14 without being in contact with the side surfaces of the respective contact trenches 14 in both cases illustrated in FIG. 36 and FIG. 37. The contact region 5 is in contact with the polysilicon film 15. The top surface of the polysilicon film 15 in the middle is not necessarily provided with the recess 15*x*, but may be a flat surface instead. The other configurations of the semiconductor device according to the eleventh embodiment are the same as those of the semiconductor device according to the tenth embodiment, and overlapping explanations are not repeated below.

The semiconductor device according to the eleventh embodiment having the configuration described above can also lead the polysilicon film 15 to be in ohmic contact with the buried part 30*a* of the contact part 30. This configuration can decrease the width and the depth of the p$^+$-type contact region 5 in contact with the bottom surface and the side surfaces of the respective contact trenches 14 upon the formation of the contact region 5 by the implantation of the p-type impurity ions into the bottom surface of the respective contact trenches 14, as compared with the case of not being provided with the polysilicon film 15, so as to avoid a variation in the gate threshold voltage derived from the wafer process.

Twelfth Embodiment

A horizontal cross section of a semiconductor device according to a twelfth embodiment differs from the horizontal cross section of the semiconductor device according to the tenth embodiment illustrated in FIG. 33 in that the polysilicon film 15 is provided instead of the buried part 30*a*. A vertical cross section of the semiconductor device according to the twelfth embodiment taken along line A-A' in FIG. 33 is common to the vertical cross section of the semiconductor device according to the tenth embodiment illustrated in FIG. 34.

The vertical cross section of the semiconductor device according to the twelfth embodiment taken along line B-B' in FIG. 33 is common to the vertical cross section of the semiconductor device according to the ninth embodiment illustrated in FIG. 32. As illustrated in FIG. 32, the semiconductor device according to the twelfth embodiment differs from the semiconductor device according to the tenth embodiment illustrated in FIG. 30 in that the polysilicon film 15 is buried to reach the upper part of the respective contact trenches 14. The polysilicon film 15 is in contact with the plug part 30*b* of the contact part 30.

Figure 38:
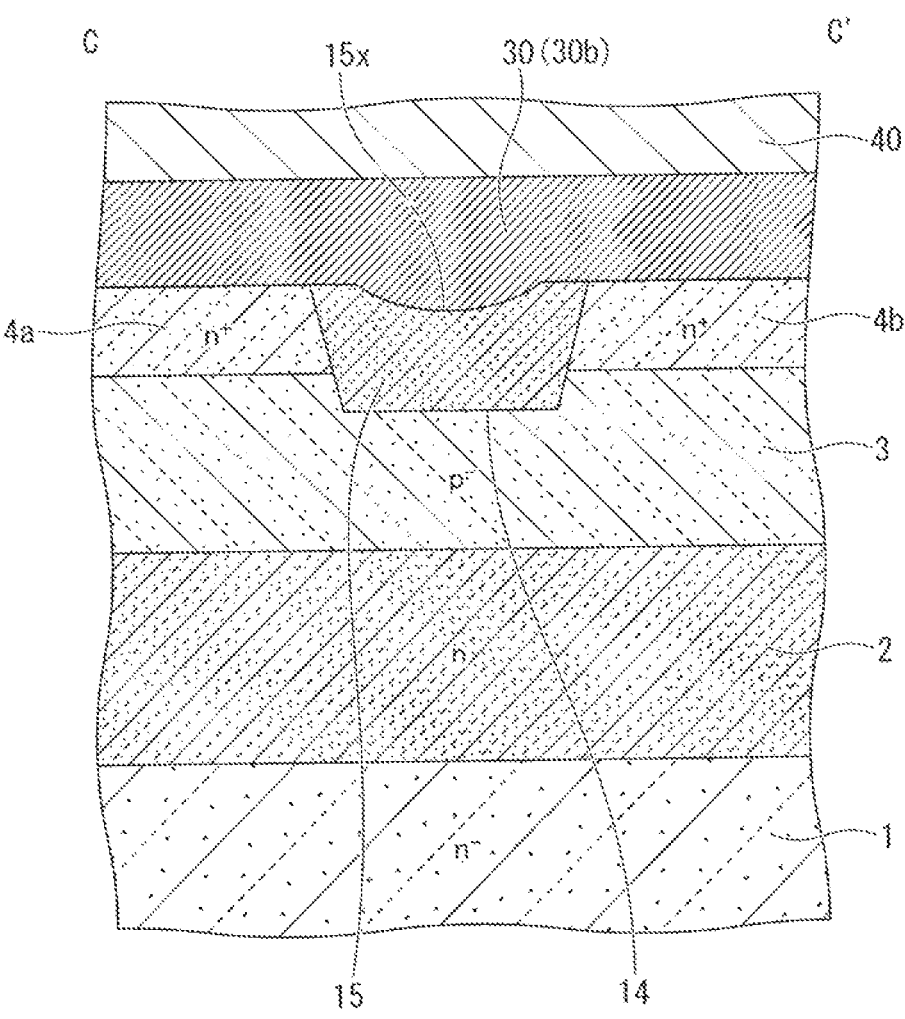
FIG. 38 is a vertical cross-sectional view illustrating an example of a semiconductor device according to a twelfth embodiment.

FIG. 38 is a vertical cross-sectional view illustrating the semiconductor device according to the twelfth embodiment taken along line C-C' in FIG. 33. As illustrated in FIG. 38, the semiconductor device according to the twelfth embodiment differs from the semiconductor device according to the tenth embodiment illustrated in FIG. 35 in that the polysilicon film 15 is buried to reach the upper part of the respective contact trenches 14. The polysilicon film 15 is in contact with the plug part 30*b* of the contact plug 30. The top surface of the polysilicon film 15 in the middle is not necessarily provided with the recess 15*x*, but may be a flat surface instead. The other configurations of the semiconductor device according to the twelfth embodiment are the same as those of the semiconductor device according to the tenth embodiment, and overlapping explanations are not repeated below.

The semiconductor device according to the twelfth embodiment, which has the configuration in which the polysilicon film 15 is deposited up to the upper part of the respective contact trenches 14, can also lead the polysilicon film 15 to be in ohmic contact with the plug part 30*b* of the contact part 30. The present embodiment thus does not need to execute the implantation of the p-type impurity ions into the bottom surface of the respective contact trenches 14, so as to avoid a variation in the gate threshold voltage derived from the wafer process.

Thirteenth Embodiment

Figure 39:
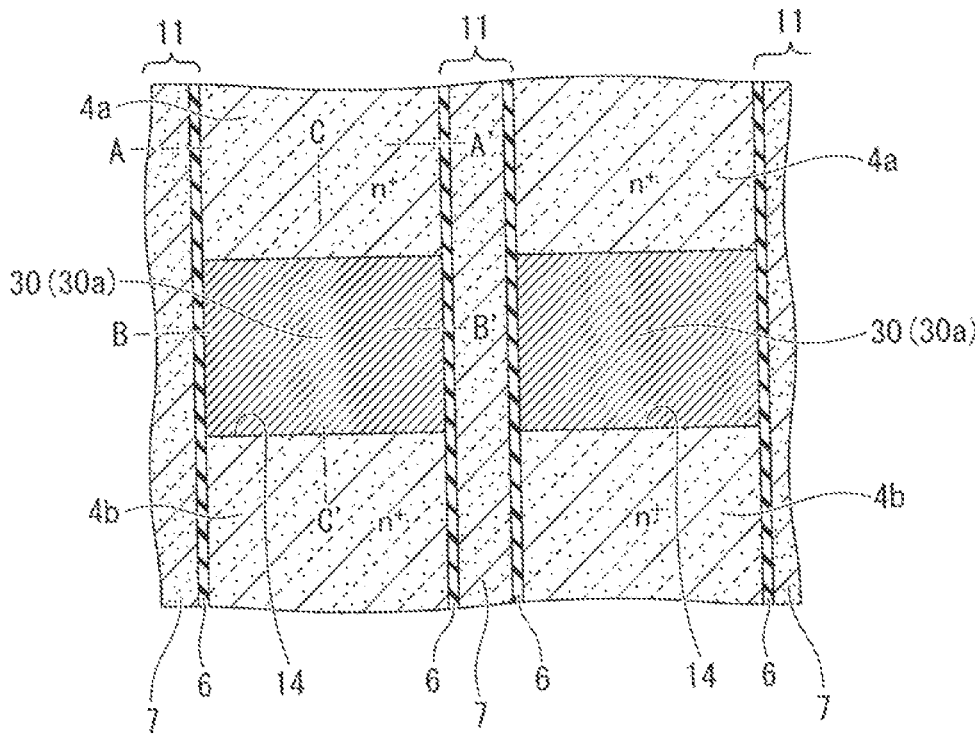
FIG. 39 is a horizontal cross-sectional view illustrating an example of a semiconductor device according to a thirteenth embodiment.

FIG. 39 is a horizontal cross-sectional view illustrating a semiconductor device according to a thirteenth embodiment. As illustrated in FIG. 39, the semiconductor device according to the thirteenth embodiment has a configuration common to that of the semiconductor device according to the tenth embodiment illustrated in FIG. 33 in that the contact trenches 14 are provided intermittently in the extending direction of the respective gate trenches 11. The semiconductor device according to the thirteenth embodiment differs from the semiconductor device according to the tenth embodiment illustrated in FIG. 33 in that the contact trenches 14 are provided to be in contact with the adjacent gate trenches 11 in the direction perpendicular to the extending direction of the respective gate trenches 11. The respective contact trenches 14 are arranged across the gate trenches 11 adjacent to each other.

Figure 40:
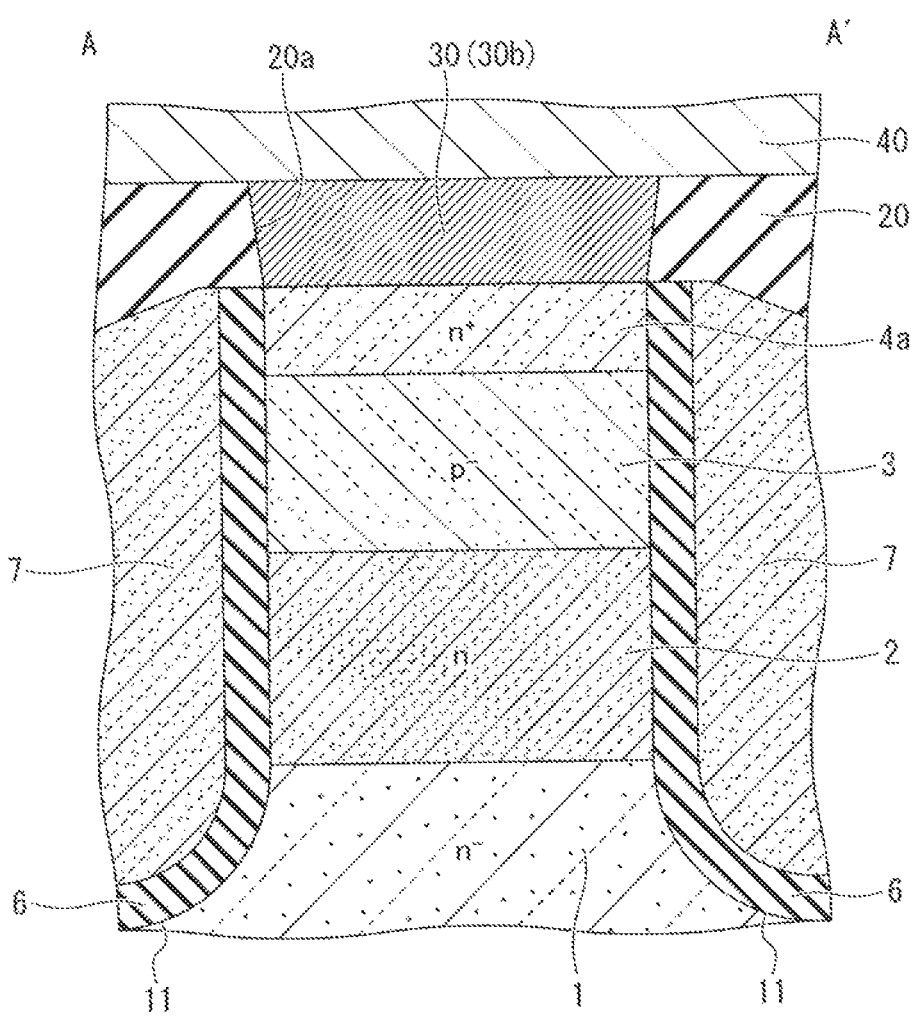
FIG. 40 is a vertical cross-sectional view taken along line A-A' in FIG. 39.

FIG. 40 is a vertical cross-sectional view illustrating the semiconductor device according to the thirteenth embodiment taken along line A-A' in FIG. 39. As illustrated in FIG. 40, the semiconductor device according to the thirteenth embodiment differs from the semiconductor device according to the tenth embodiment illustrated in FIG. 34 in that the contact hole 20*a* of the interlayer insulating film 20 provided on the top surface of the emitter region 4*a* has a wider width.

Figure 41:
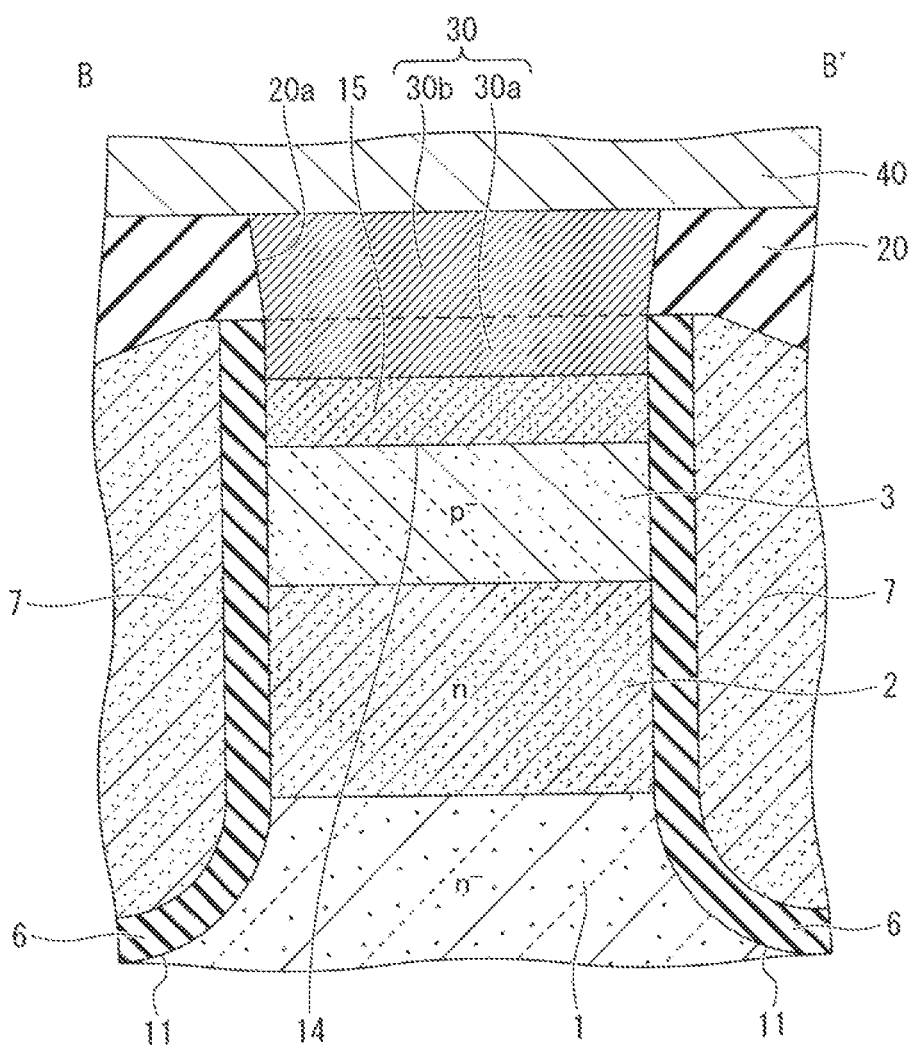
FIG. 41 is a vertical cross-sectional view taken along line B-B' in FIG. 39.

FIG. 41 is a vertical cross-sectional view illustrating the semiconductor device according to the thirteenth embodiment taken along line B-B' in FIG. 39. As illustrated in FIG. 41, the semiconductor device according to the thirteenth embodiment differs from the semiconductor device according to the tenth embodiment illustrated in FIG. 30 in that the both sides of the respective contact trenches 14 are in contact with the gate trenches 11 adjacent to each other. The polysilicon film 15 and the buried part 30*a* of the contact part 30 provided in the respective contact trenches 14 are also in contact with the gate trenches 11 adjacent to each other. The top surface of the polysilicon film 15 illustrated in FIG. 41 may be provided with the recess 15*x* in the middle.

The vertical cross section of the semiconductor device according to the thirteenth embodiment taken along line C-C' in FIG. 39 is common to the vertical cross section of the semiconductor device according to the tenth embodiment illustrated in FIG. 35. The other configurations of the semiconductor device according to the thirteenth embodiment are the same as those of the semiconductor device according to the tenth embodiment, and overlapping explanations are not repeated below.

The semiconductor device according to the thirteenth embodiment, which has the configuration in which the respective contact trenches 14 are in contact with the adjacent gate trenches 11, can also lead the polysilicon film 15 to be in ohmic contact with the contact part 30. The present embodiment thus does not need to execute the implantation of the p-type impurity ions into the bottom surface of the respective contact trenches 14, so as to avoid a variation in the gate threshold voltage derived from the wafer process.

Fourteenth Embodiment

A horizontal cross section of a semiconductor device according to a fourteenth embodiment is common to the horizontal cross section of the semiconductor device according to the thirteenth embodiment illustrated in FIG. 39. A vertical cross section of the semiconductor device according to the fourteenth embodiment taken along line A-A' in FIG. 39 is common to the vertical cross section of the semiconductor device according to the thirteenth embodiment illustrated in FIG. 40.

Figure 42:
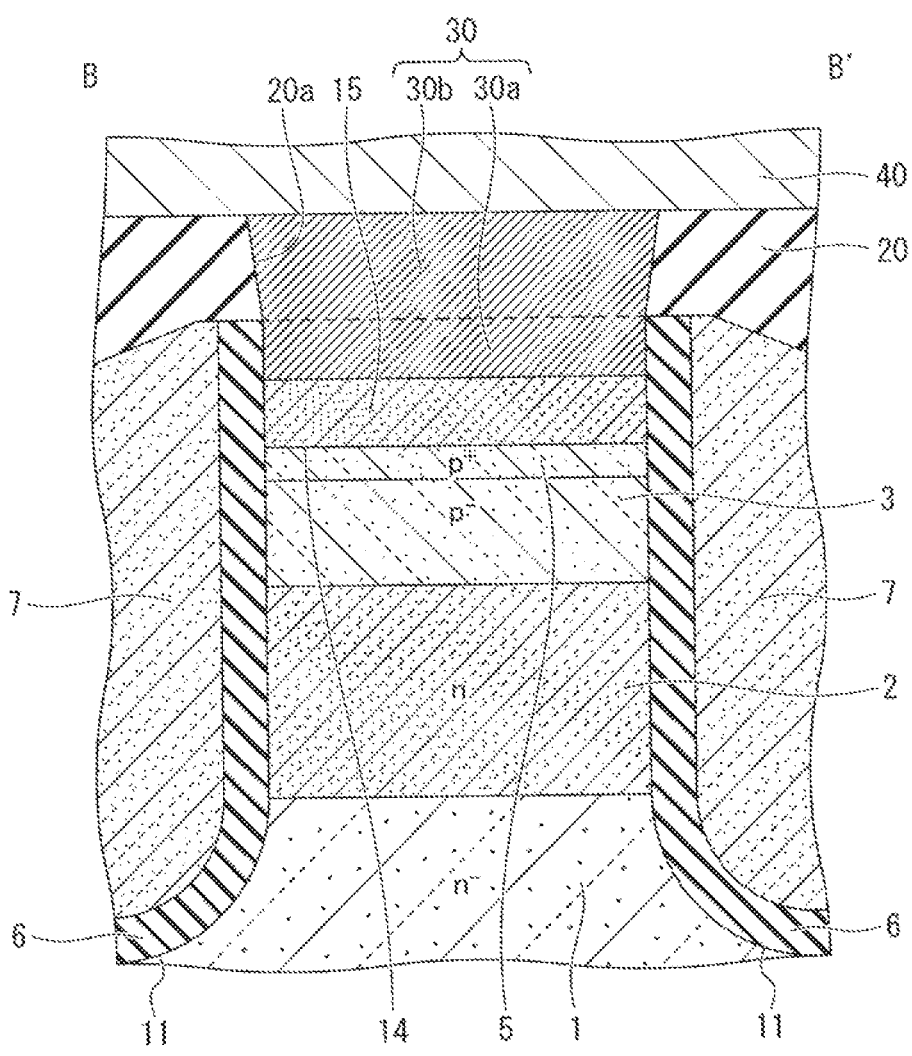
FIG. 42 is a vertical cross-sectional view illustrating an example of a semiconductor device according to a fourteenth embodiment.

FIG. 42 is a vertical cross-sectional view illustrating the semiconductor device according to the fourteenth embodiment taken along line B-B' in FIG. 39. As illustrated in FIG. 42, the semiconductor device according to the fourteenth embodiment differs from the semiconductor device according to the thirteenth embodiment illustrated in FIG. 41 in that the p$^+$-type contact region 5 is provided so as to be in contact with the bottom surface of the respective contact trenches 14. The top surface of the polysilicon film 15 may be provided with the recess 15*x* in the middle.

The vertical cross section of the semiconductor device according to the fourteenth embodiment taken along line C-C' in FIG. 39 is common to the vertical cross section of the semiconductor device according to the eleventh embodiment illustrated in FIG. 37. The other configurations of the semiconductor device according to the fourteenth embodiment are the same as those of the semiconductor device according to the thirteenth embodiment, and overlapping explanations are not repeated below.

The semiconductor device according to the fourteenth embodiment having the configuration described above can also lead the polysilicon film 15 to be in ohmic contact with the buried part 30*a* of the contact part 30. This configuration can decrease the width and the depth of the p$^+$-type contact region 5 in contact with the respective contact trenches 14 upon the formation of the contact region 5 by the implantation of the p-type impurity ions into the bottom surface of the respective contact trenches 14, so as to avoid a variation in the gate threshold voltage derived from the wafer process.

Fifteenth Embodiment

A horizontal cross section of a semiconductor device according to a fifteenth embodiment differs from the horizontal cross section of the semiconductor device according to the thirteenth embodiment illustrated in FIG. 39 in that the polysilicon film 15 is provided instead of the buried part 30*a*. A vertical cross section of the semiconductor device according to the fifteenth embodiment taken along line A-A' in FIG. 39 is common to the vertical cross section of the semiconductor device according to the thirteenth embodiment illustrated in FIG. 40.

Figure 43:
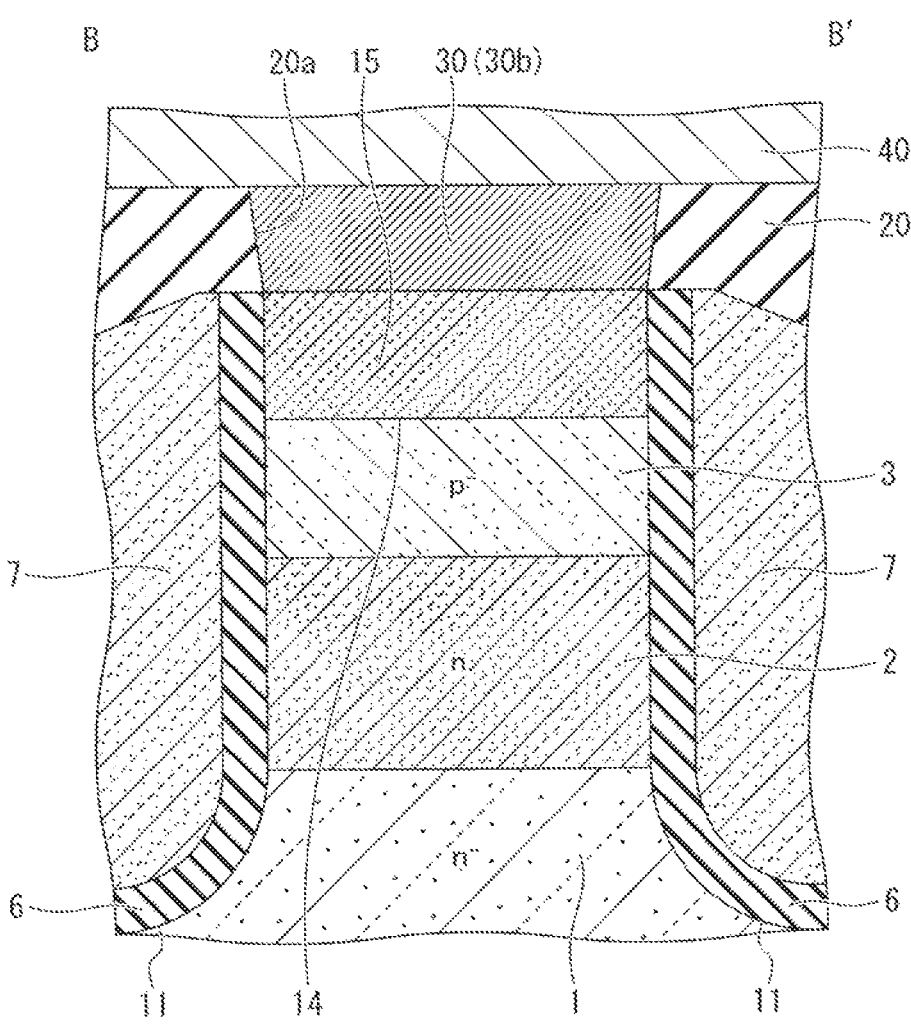
FIG. 43 is a vertical cross-sectional view illustrating an example of a semiconductor device according to a fifteenth embodiment.

FIG. 43 is a vertical cross-sectional view illustrating the semiconductor device according to the fifteenth embodiment taken along line B-B' in FIG. 39. As illustrated in FIG. 43, the semiconductor device according to the fifteenth embodiment differs from the semiconductor device according to the thirteenth embodiment illustrated in FIG. 41 in that the polysilicon film 15 is buried to reach the upper part of the respective contact trenches 14. The polysilicon film 15 is in contact with the plug part 30*b* of the contact part 30. The top surface of the polysilicon film 15 may be provided with the recess 15*x* in the middle.

The vertical cross section of the semiconductor device according to the fifteenth embodiment taken along line C-C' in FIG. 39 is common to the vertical cross section of the semiconductor device according to the twelfth embodiment illustrated in FIG. 38. As illustrated in FIG. 38, the semiconductor device according to the fifteenth embodiment differs from the semiconductor device according to the thirteenth embodiment illustrated in FIG. 35 in that the polysilicon film 15 is buried to reach the upper part of the respective contact trenches 14. The other configurations of the semiconductor device according to the fifteenth embodiment are the same as those of the semiconductor device according to the thirteenth embodiment, and overlapping explanations are not repeated below.

The semiconductor device according to the fifteenth embodiment, which has the configuration in which the polysilicon film 15 is deposited up to the upper part of the respective contact trenches 14, can also lead the polysilicon film 15 to be in ohmic contact with the plug part 30*b* of the contact part 30. The present embodiment thus does not need to execute the implantation of the p-type impurity ions into the bottom surface of the respective contact trenches 14, so as to avoid a variation in the gate threshold voltage derived from the wafer process.

Sixteenth Embodiment

Figure 44:
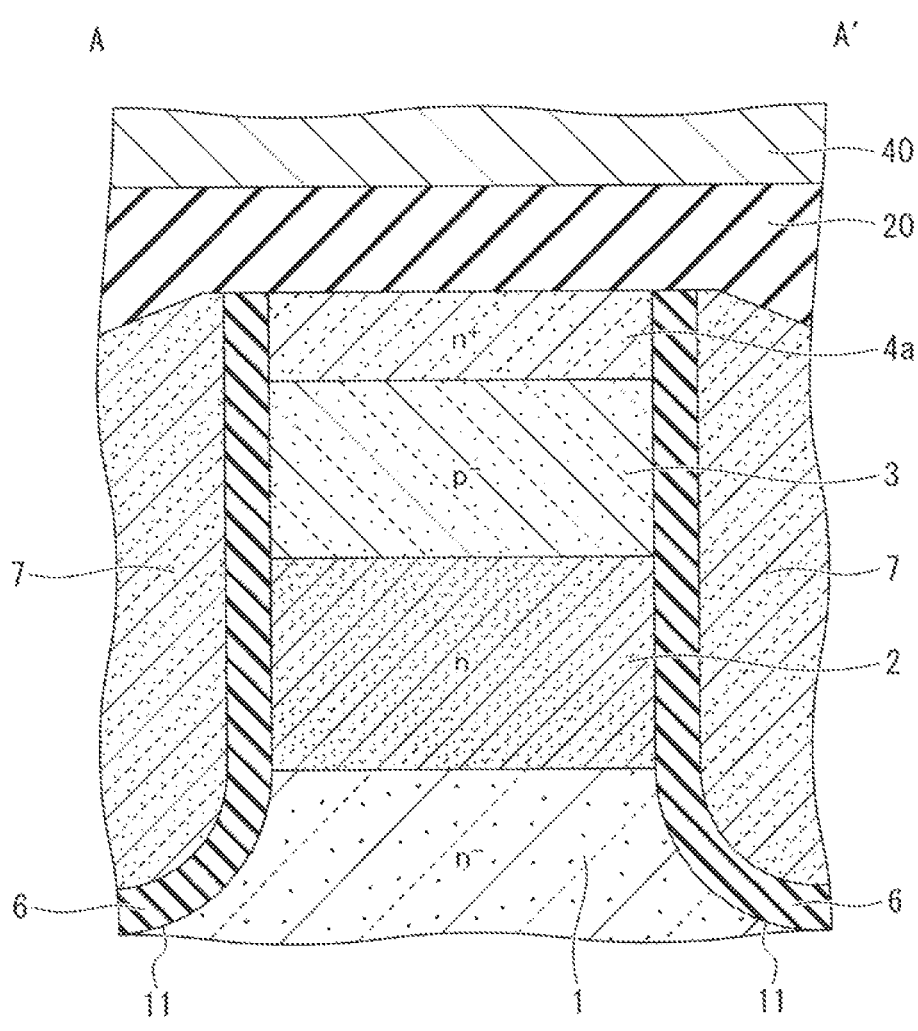
FIG. 44 is a vertical cross-sectional view illustrating an example of a semiconductor device according to a sixteenth embodiment.

A horizontal cross section of a semiconductor device according to a sixteenth embodiment is common to the horizontal cross section of the semiconductor device according to the thirteenth embodiment illustrated in FIG. 39. FIG. 44 is a vertical cross-sectional view illustrating the semiconductor device according to the sixteenth embodiment taken along line A-A' in FIG. 39. As illustrated in FIG. 44, the semiconductor device according to the sixteenth embodiment differs from the semiconductor device according to the thirteenth embodiment illustrated in FIG. 40 in that any contact holes are not provided in the interlayer insulating film 20 deposited on the top surface of the emitter region 4*a*.

Figure 45:
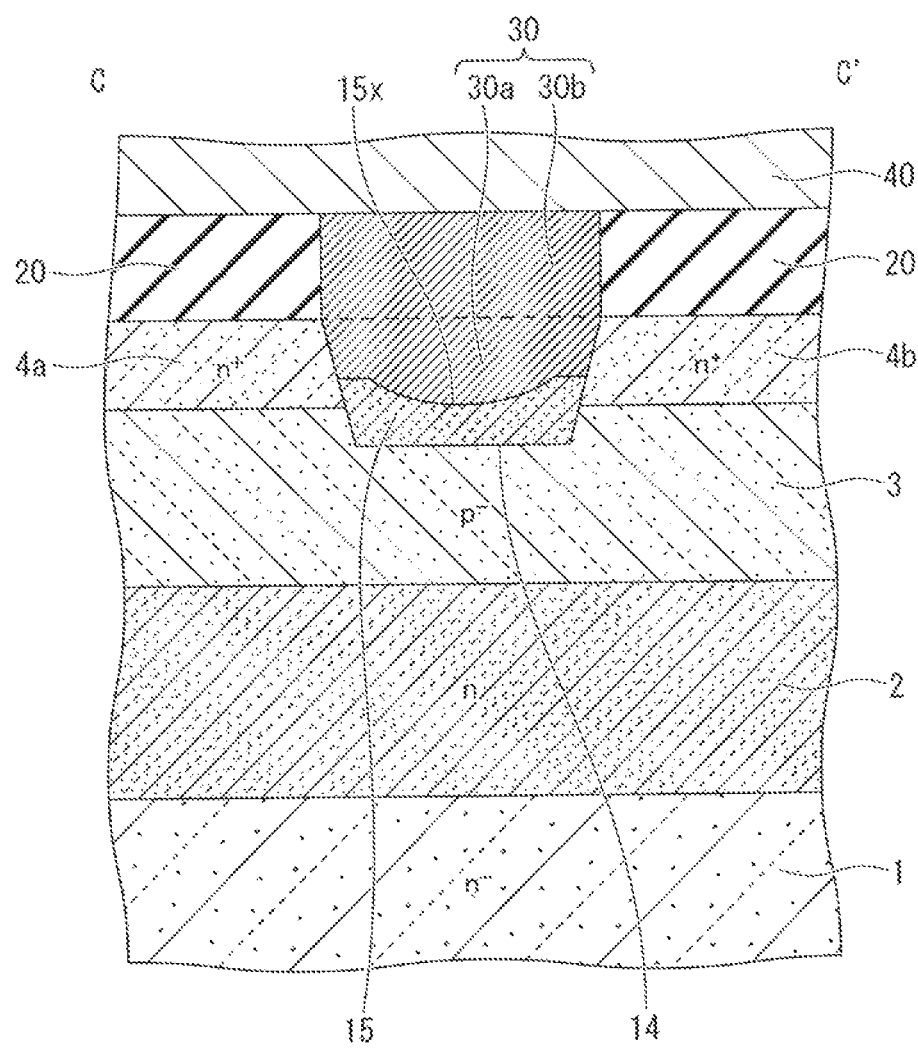
FIG. 45 is a vertical cross-sectional view illustrating the example of the semiconductor device according to the sixteenth embodiment.

The vertical cross section of the semiconductor device according to the sixteenth embodiment taken along line B-B' in FIG. 39 is common to the vertical cross section of the semiconductor device according to the thirteenth embodiment illustrated in FIG. 41. FIG. 45 is a vertical cross-sectional view illustrating the semiconductor device according to the sixteenth embodiment taken along line C-C' in FIG. 39. The vertical cross section of the semiconductor device according to the sixteenth embodiment illustrated in FIG. 45 differs from the vertical cross section of the semiconductor device according to the thirteenth embodiment illustrated in FIG. 35 in that the plug part 30*b* is buried in the interlayer insulating film 20. In this case, the side surfaces of the respective emitter regions 4*a* and 4*b* are in contact with the buried part 30*a* of the contact part 30, as illustrated in FIG. 45. The top surface of the polysilicon film 15 is not necessarily provided with the recess 15*x* in the middle, but may be a flat surface instead. The other configurations of the semiconductor device according to the sixteenth embodiment are the same as those of the semiconductor device according to the thirteenth embodiment, and overlapping explanations are not repeated below.

The semiconductor device according to the sixteenth embodiment, which has the configuration in which any contact holes are not provided in the interlayer insulating film 20 provided on the top surface of the emitter region 4*a*, can also lead the polysilicon film 15 to be in ohmic contact with the contact part 30. The present embodiment thus does not need to execute the implantation of the p-type impurity ions into the bottom surface of the respective contact trenches 14, so as to avoid a variation in the gate threshold voltage derived from the wafer process.

Seventeenth Embodiment

A horizontal cross section of a semiconductor device according to a seventeenth embodiment differs from the horizontal cross section of the semiconductor device according to the tenth embodiment illustrated in FIG. 33 in that the respective contact regions 5*a* and 5*b* are provided at the upper part of the base region 3. A vertical cross section of the semiconductor device according to the seventeenth embodiment including the emitter region 4 in a direction perpendicular to the extending direction of the respective gate trenches 11 is common to the cross section taken along line A-A in FIG. 33, and is also common to the vertical cross section of the semiconductor device according to the fifteenth embodiment illustrated in FIG. 44. A vertical cross section of the semiconductor device according to the seventeenth embodiment including the contact regions 5*a* and 5*b* in the direction perpendicular to the extending direction of the respective gate trenches 11 is common to the cross section taken along line B-B' in FIG. 1, and is also common to the vertical cross section of the semiconductor device according to the first embodiment illustrated in FIG. 4. A cross section of the semiconductor device according to the seventeenth embodiment regarding the contact part 30 in a direction parallel to the extending direction of the respective gate trenches 11 is common to the cross section along line C-C' in FIG. 33, and is also common to the vertical cross section of the semiconductor device according to the sixteenth embodiment illustrated in FIG. 35 or the vertical cross section of the semiconductor device according to the eleventh embodiment illustrated in FIG. 37.

The semiconductor device according to the seventeenth embodiment, which has the configuration including the contact region 5, can reduce the influence of diffusion of the p-type impurity ions from the polysilicon film 15 toward the base region 3 in association with heating during reflow, for example, as compared with the configuration of the semiconductor device according to the fifteenth embodiment.

The vertical cross section of the semiconductor device according to the seventeenth embodiment including the contact regions 5*a* and 5*b* in the direction perpendicular to the extending direction of the respective gate trenches 11 may be common to the vertical cross section of the semiconductor device according to the second embodiment illustrated in FIG. 18 or the vertical cross section of the semiconductor device according to the third embodiment illustrated in FIG. 20, and the cross section regarding the contact part 30 in the direction parallel to the extending direction of the respective gate trenches 11 may be common to the vertical cross section of the semiconductor device according to the eleventh embodiment illustrated in FIG. 37. Such a configuration can achieve the effects similar to those of the semiconductor device according to the seventeenth embodiment.

Other Embodiments

As described above, the invention has been described according to the first to seventeenth embodiments, but it should not be understood that the description and drawings implementing a portion of this disclosure limit the invention. Various alternative embodiments of the present invention, examples, and operational techniques will be apparent to those skilled in the art from this disclosure.

While the semiconductor devices according to the first to seventeenth embodiments have been illustrated with the IGBT, the present invention can also be applied to a reverse-conducting IGBT (a RC-IGBT) or a reverse-blocking IGBT (RB-IGBT). The RC-IGBT can use the contact trench structure of the respective semiconductor devices according to the first to seventeenth embodiments for the contact trench in the mesa part of the transistor part and the contact trench in the mesa part of the diode part including the IGBT. The mesa part as used herein corresponds to a part between the trenches adjacent to each other. The present invention may also be applied to a MOSFET having a configuration in which a drain region of n-type is used instead of the p$^+$-type collector region 9 of the IGBT illustrated in FIG. 2.

Further, the configurations disclosed in the first to seventeenth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A semiconductor device comprising:

a semiconductor substrate of a first conductivity-type;

an insulated gate electrode structure buried in a first trench provided in the semiconductor substrate;

a base region of a second conductivity-type provided in the semiconductor substrate so as to be in contact with the first trench;

a first main electrode region of the first conductivity-type provided at an upper part of the base region so as to be in contact with the first trench;

a polysilicon film of the second conductivity-type having a higher impurity concentration than the base region and buried in a second trench provided in the semiconductor substrate so as to be in contact with the base region; and a second main electrode region provided on a bottom surface side of the semiconductor substrate.

2. The semiconductor device of claim 1, wherein the first trench and the second trench are arranged separately from each other.

3. The semiconductor device of claim 1, wherein the second trench is not provided in the first main electrode region.

4. The semiconductor device of claim 1, wherein the second trench is provided in the first main electrode region.

5. The semiconductor device of claim 4, wherein the second trench penetrates the first main electrode region to reach the base region.

6. The semiconductor device of claim 1, wherein the first trench and the second trench are in contact with each other.

7. The semiconductor device of claim 1, further comprising a contact region of the second conductivity-type provided in contact with the first main electrode region.

8. The semiconductor device of claim 7, wherein the contact region is in contact with a bottom surface of the second trench.

9. The semiconductor device of claim 1, further comprising a contact part buried in the second trench with the polysilicon film interposed.

10. The semiconductor device of claim 1, wherein a top surface of the polysilicon film is located at a same level as a top surface of the first main electrode region.

11. The semiconductor device of claim 7, wherein:

the first trench and the second trench extend in a stripe-shaped state in a common direction; and the first main electrode region and the contact region are alternately arranged in a direction parallel to the extending direction of the first trench and the second trench.

12. The semiconductor device of claim 1, wherein a top surface of the polysilicon film is provided with a recess.

13. The semiconductor device of claim 1, wherein:

the first main electrode region has a shallower depth than the second trench; and the second trench penetrates the first main electrode region to reach the base region.

14. The semiconductor device of claim 13, wherein the polysilicon film is in contact with the first main electrode region and the base region.

15. The semiconductor device of claim 7, wherein:

the contact region has a shallower depth than the second trench; and the second trench penetrates the contact region to reach the base region.

16. The semiconductor device of claim 15, wherein the polysilicon film is in contact with the contact region and the base region.

17. The semiconductor device of claim 1, wherein:

the first main electrode region has a greater depth than the second trench; and a bottom surface of the second trench is located inside the first main electrode region.

18. The semiconductor device of claim 17, wherein the polysilicon film is in contact with the first main electrode region and is provided separately from the base region.

19. The semiconductor device of claim 7, wherein:

the contact region has a greater depth than the second trench; and a bottom surface of the second trench is located inside the contact region.

20. The semiconductor device of claim 19, wherein the polysilicon film is in contact with the contact region and is provided separately from the base region.

21. The semiconductor device of claim 1, wherein a top surface of the polysilicon film is a flat surface.

22. The semiconductor device of claim 13, wherein the polysilicon film is in contact with the base region and is provided separately from the first main electrode region.

23. The semiconductor device of claim 1, wherein the polysilicon film is provided along a bottom surface and a part of a side surface of the second trench.

24. The semiconductor device of claim 1, wherein:

the first trench and the second trench extend in a stripe-shaped state in a common direction; and the first main electrode region and the contact region extend in a stripe-shaped state parallel to the extending direction of the first trench and the second trench.

25. The semiconductor device of claim 24, wherein the second trench is provided at an upper part of the contact region.

26. The semiconductor device of claim 1, wherein the polysilicon film is selectively provided at a corner defined by a side surface and a bottom surface of the second trench.

27. The semiconductor device of claim 7, wherein the contact region has a greater depth than the first main electrode region.

28. A method of manufacturing a semiconductor device, comprising forming a first trench in a semiconductor substrate of a first conductivity-type;

forming an insulated gate electrode structure in a first trench;

forming a base region of a second conductivity-type in the semiconductor substrate so as to be in contact with the first trench;

forming a first main electrode region of the first conductivity-type at an upper part of the base region so as to be in contact with the first trench;

forming a second trench at an upper part of the semiconductor substrate so as to be in contact with the base region;

burying a polysilicon film of the second conductivity-type having a higher impurity concentration than the base region in the second trench; and forming a second main electrode region on a bottom surface side of the semiconductor substrate.

\* \* \* \* \*